US006501138B1

(12) United States Patent
Karasawa

(10) Patent No.: US 6,501,138 B1
(45) Date of Patent: Dec. 31, 2002

(54) SEMICONDUCTOR MEMORY DEVICE AND METHOD FOR MANUFACTURING THE SAME

(75) Inventor: Junichi Karasawa, Tatsuno-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/550,767

(22) Filed: Apr. 17, 2000

(30) Foreign Application Priority Data

Apr. 16, 1999 (JP) .......................................... 11-109043

(51) Int. Cl.$^7$ .......................... H01L 29/76; H01L 27/11
(52) U.S. Cl. ........................ 257/371; 257/369; 257/903
(58) Field of Search ............................... 257/204, 202, 257/206, 369, 393, 903, 904, 207, 909, 371; 438/926

(56) References Cited

U.S. PATENT DOCUMENTS

| | | | | |
|---|---|---|---|---|
| 4,728,621 A | * | 3/1988 | Graf et al. ..................... | 437/41 |
| 5,396,100 A | * | 3/1995 | Yamasaki et al. ........... | 257/390 |
| 5,783,470 A | * | 7/1998 | Rostoker ..................... | 438/253 |
| 5,811,858 A | * | 9/1998 | Ohkubo ....................... | 257/369 |
| 5,972,768 A | * | 10/1999 | Nagayasu et al. .......... | 438/370 |
| 6,005,296 A | * | 12/1999 | Chan ........................... | 257/904 |
| 6,127,700 A | * | 10/2000 | Bulucea ....................... | 257/335 |
| 6,160,298 A | * | 12/2000 | Ohkubo et al. ............. | 257/393 |
| 6,282,143 B1 | * | 8/2001 | Zhang et al. ........... | 365/230.05 |
| 6,291,852 B1 | * | 9/2001 | Yano et al. .................. | 257/314 |
| 6,320,234 B1 | * | 11/2001 | Karasawa et al. .......... | 257/371 |

* cited by examiner

Primary Examiner—Nathan J. Flynn
Assistant Examiner—Johannes Mondt

(74) Attorney, Agent, or Firm—Hogan & Hartson, LLP

(57) ABSTRACT

A semiconductor substrate has a main surface, a well, a plurality of memory cells, a first memory cell region, a second memory cell region, a border region, a well contact region, a first dummy element, a second dummy element, a first transistor and a second transistor. The first and second memory cell regions are located over the well. The memory cells are formed in the first and second memory cell regions. The border region is located over the well on a border between the first memory cell region and the second memory cell region. The well contact region is formed in the well in the border region and is electrically connected to a wiring layer for fixing the voltage of the well. The first and second dummy elements are formed in the border. The first transistor, that is a component of the memory cell, is formed in the first memory cell region and is located adjacent to the first dummy element. The second transistor, that is a component of the memory cell, is formed in the second memory cell region and is located adjacent to the second dummy element. The border region has a length that is equivalent to the sum of one half of the length between one of side sections of a gate electrode of the first transistor on the side of the first dummy element and one of side sections of the first dummy element on the side of the gate electrode of the first transistor, the length of the first dummy element, the length between one of the side sections of the first dummy element on the side of the second dummy element and one of side sections of the second dummy element on the side of the first dummy element, the length of the second dummy element, and one half of the length between one of side sections of a gate electrode of the second transistor on the side of the second dummy element and one of the side sections of the second dummy element on the side of the gate electrode of the second transistor.

23 Claims, 22 Drawing Sheets

SEMICONDUCTOR MEMORY DEVICE AND METHOD FOR MANUFACTURING THE SAME

BACKGROUND OF THE INVENTION

1. Field of the Invention

The present invention relates to a semiconductor memory device such as an SRAM, and a method for manufacturing the same.

2. Description of Related Art

A semiconductor memory device has a structure in which peripheral circuits and memory cell arrays consisting of numerous memory cells are formed on a semiconductor substrate. To increase the capacity of a semiconductor memory device, a higher integration of the semiconductor memory device needs to be attained. In particular, an SRAM (Static Random Access Memory) has a large number of device elements that form each memory cell, and therefore a higher integration therefore is required.

The present invention has been made to solve the above-described problems. It is an object of the present invention to provide a semiconductor memory device having a structure that can achieve a higher integration of the semiconductor memory device and a method for manufacturing the semiconductor memory device.

SUMMARY OF PREFERRED EMBODIMENTS

In accordance with an embodiment of the present invention, a semiconductor memory device comprises a semiconductor substrate having a main surface, a well, a plurality of memory cells, a first memory cell region, a second memory cell region, a border region, a well contact region, a first dummy element, a second dummy element, a first transistor and a second transistor. The well is formed in the semiconductor substrate. The first and second memory cell regions are part of the main surface and are located over the well. The memory cells are formed in the first and second memory cell regions. The border region is part of the main surface, and is located over the well on a border between the first memory cell region and the second memory cell region. The well contact region is formed in the well in the border region. The well contact region electrically connects to a wiring layer for fixing the voltage of the well. The first and second dummy elements are formed in the border region and do not function as device elements. The first transistor is a component of the memory cell. The first transistor is formed in the first memory cell region and is located adjacent to the first dummy element. The second transistor is a component of the memory cell. The second transistor is formed in the second memory cell region and is located adjacent to the second dummy element. The border region has a length that is equivalent to the total of one half of the length between one of side sections of a gate electrode of the first transistor on the side of the first dummy element and one of side sections of the first dummy element on the side of the gate electrode of the first transistor, the length of the first dummy element, the length between one of the side sections of the first dummy element on the side of the second dummy element and one of side sections of the second dummy element on the side of the first dummy element, the length of the second dummy element, and one half of the length between one of side sections of a gate electrode of the second transistor on the side of the second dummy element and one of the side sections of the second dummy element on the side of the gate electrode of the second transistor.

In the semiconductor memory device in accordance with the present invention, the border region has a length defined by the above-described values. As a result, while dummy elements are formed, a higher integration of a semiconductor memory device and the reduction of the chip size can be achieved. In other words, a higher integration of a semiconductor memory device can be achieved with the same chip size. On the other hand, the chip size can be reduced with the same number of element devices.

In a preferred embodiment, the border region is located between the first memory cell region and the second memory cell region. A predetermined number of memory cells are formed in each of the first and second memory cell regions. A well contact region is formed in the well in the border region. The well contact region electrically connects to a wiring layer for fixing the voltage of the well containing these memory cells.

Also, dummy elements are formed in the border region. The dummy elements are formed to prevent the optical proximity effect and the loading effect. In other words, if the dummy elements are not formed in the border region, the pattern density in the border region becomes different from the pattern density in the first and second memory cell regions. As a consequence, the optical proximity effect and the loading effect may occur near the border region. Accordingly, a designed memory cell pattern is not obtained near the border region. As a result, memory cells near the border region may become defective.

In a preferred embodiment, the well contact region may be formed in a self-alignment manner, using the first and second dummy elements as masks.

Preferably, the well contact region may be of a first conductivity type. Further, the semiconductor memory device may preferably have word lines wherein the word lines extends from the first memory cell region to the second memory cell region passing through the border region, and the word line are of a second conductivity type.

In accordance with one embodiment of the present invention, each of the memory cells may preferably include a first load transistor, a second load transistor, a first driver transistor and a second driver transistor that form a flip-flop.

The semiconductor memory device in accordance with one embodiment of the present invention may preferably further include a first conductive layer and a second conductive layer. The first and second conductive layers are respectively formed in the first and second memory cell regions. The first conductive layer serves as gate electrodes of the first load transistor and the first driver transistor. The second conductive layer servers as gate electrodes of the second load transistor and the second driver transistor. Preferably, the first conductive layer is generally in the shape of a letter "h" and the second conductive layer is generally in the shape of the number "7".

In accordance with one embodiment of the present invention, the semiconductor memory device may preferably form an SRAM.

In accordance with one embodiment of the present invention, each of the first and second dummy elements in the semiconductor memory device has a length equivalent to the length of a gate electrode of each of the memory cells.

In accordance with one embodiment of the present invention, one half of the length of each of the first and second dummy elements is greater than an alignment error that occurs when a mask member to be used for forming the well contact region is formed. One half of the length of a dummy element refers to one half of the gate length of the dummy gate when a side wall dielectric film is not formed on a side of the dummy element. When a side wall dielectric film is formed on the side of the dummy element, it refers to one half of the length of the dummy element plus the length of the side wall dielectric film.

In accordance with one embodiment of the present invention, a semiconductor memory device has a semiconductor substrate having a main surface, a well, a plurality of memory cells, a first memory cell region, a second memory cell region, a border region, a first source region, a second source region, a well contact region, a first dummy element and a second dummy element. The well is formed in the semiconductor substrate. The first and second memory cell regions are part of the main surface and are located over the well. The memory cells are formed in the first and second memory cell regions. The border region is part of the main surface, and is located over the well on a border between the first memory cell region and the second memory cell region. The first source region is formed in the well, and extends over the border region and the first memory cell region. The second source region is formed in the well, and extends over the border region and the second memory cell region. The well contact region is formed in the well in the border region. The well contact region electrically connects to a wiring layer for fixing the voltage of the well. The first and second dummy elements are formed in the border region and do not function as device elements. The border region has a length that is equivalent to the total length of one half of the length of the first source region, the length of the first dummy element, the length of the well contact region, the length of the second dummy element and one half of the length between the second source region.

In the semiconductor memory device in accordance with the present invention, the border region has a length defined by the above-described values. As a result, while dummy elements are formed, a higher integration of a semiconductor memory device and the reduction of the chip size can be achieved. In other words, a higher integration of a semiconductor memory device can be achieved with the same chip size. The chip size can be reduced with the same number of element devices.

A semiconductor memory device in accordance with one embodiment of the present invention comprises a semiconductor substrate, a first conductivity type well region provided in the semiconductor substrate, a first memory cell region provided over the well region, a second memory cell region provided over the well region, and a border region provided over the well region and between the first memory cell region and the second memory cell region. The border region includes first and second dummy wirings disposed over the well region, a first impurity region of a second conductivity type shared by the first memory cell region and the border region and disposed adjacent to the first dummy wiring, a well contact region of a first conductivity type between the first dummy wiring and the second dummy wiring, and a second impurity region of the second conductivity type shared by the second memory cell region and the border region and disposed adjacent to the second dummy wiring.

A semiconductor memory device in accordance with one embodiment the present invention includes a semiconductor substrate having a main surface, a well, a plurality of memory cells, a first memory cell region, a second memory cell region, a border region, a well contact region, a first dummy element and a second dummy element. The well is formed in the semiconductor substrate. The first and second memory cell regions are part of the main surface and are located over the well. The memory cells are formed in the first and second memory cell regions. The border region is part of the main surface, and is located over the well on a border between the first memory cell region and the second memory cell region. The first and second dummy elements are formed in the border region and do not function as device elements. The well contact region is formed in the well in the border region, and is formed in a self-alignment manner using the first and second dummy elements as masks. The well contact region electrically connects to a wiring layer for fixing the voltage of the well.

In accordance with one embodiment of one embodiment of the present invention, a method is provided for manufacturing a semiconductor memory device having a semiconductor substrate defining a main surface that has a first memory cell region, a second memory cell region, and a border region between the first memory cell region and the second memory cell region. The method includes the step of forming wells in the semiconductor substrate below the first memory cell region, the second memory cell region and the border region, the step of forming gate electrodes in the first and second memory cell regions, the step of forming dummy gates of first and second dummy elements in the border region, the step of forming a first mask member that covers the border region and exposes the first and second memory cell regions, and the step of forming a first source/drain region of the first dummy element and a second source/drain region of the second dummy element by implanting ions of a second conductivity type in the well, using the first mask member as a mask.

The first source/drain region extends over the border region and the first memory cell region, and the second source/drain region extends over the border region and the second memory cell region. The method for manufacturing a semiconductor memory device further includes the step of forming a second mask member that covers the first and second memory cell regions and has an opening section in the border region, and the step of forming a well contact region between the first dummy element and the second dummy element by implanting ions of a first conductivity type in the well, using the second mask member, the first dummy element and the second dummy element as masks.

Preferably, the step of forming the gate electrodes in the first and second memory cell regions, and the step of forming the dummy gates of first and second dummy elements in the border region may be conducted in the same step. This reduces the number of manufacturing steps.

In the method for manufacturing a semiconductor memory device in accordance with the present invention, a positional alignment is conducted when forming the second mask member such that a side surface of the opening section is positioned over the first and second dummy elements, and one half of the length of each of the first and second dummy elements is greater than an alignment error value that may occur when forming the second mask member. This prevents the opening section from being positioned at the first and second source/drain regions. If the opening were positioned at the first and second source/drain regions, ions would be implanted in the first and second source/drain regions when the well contact region is formed. This may negatively affect the characteristics of the transistors when the "first and second source/drain regions" means source regions.

It is noted that one half of the length of a dummy element refers to one half of the gate length of the dummy element when a side wall dielectric film is not formed on a side of the dummy element. When a side wall dielectric film is formed on the side of the dummy element, it refers to one half of the length of the dummy gate plus the length of the side wall dielectric film.

The method for manufacturing a semiconductor memory device in accordance with the present invention may preferably include the step of forming a word line that extends from the first memory cell region through the border region to the second memory cell region. Also, the step of forming the second mask member may not expose the word line through the opening section of the second mask member. This prevents the word line from being injected with ions of a first conductivity type. As a result, this would prevent p-n junctions from being formed in the word line.

Other features and advantages of the invention will be apparent from the following detailed description, taken in conjunction with the accompanying drawings, which illustrate, by way of example, various features of embodiments of the invention.

DETAILED DESCRIPTION OF PREFERRED EMBODIMENTS

Figure 3:
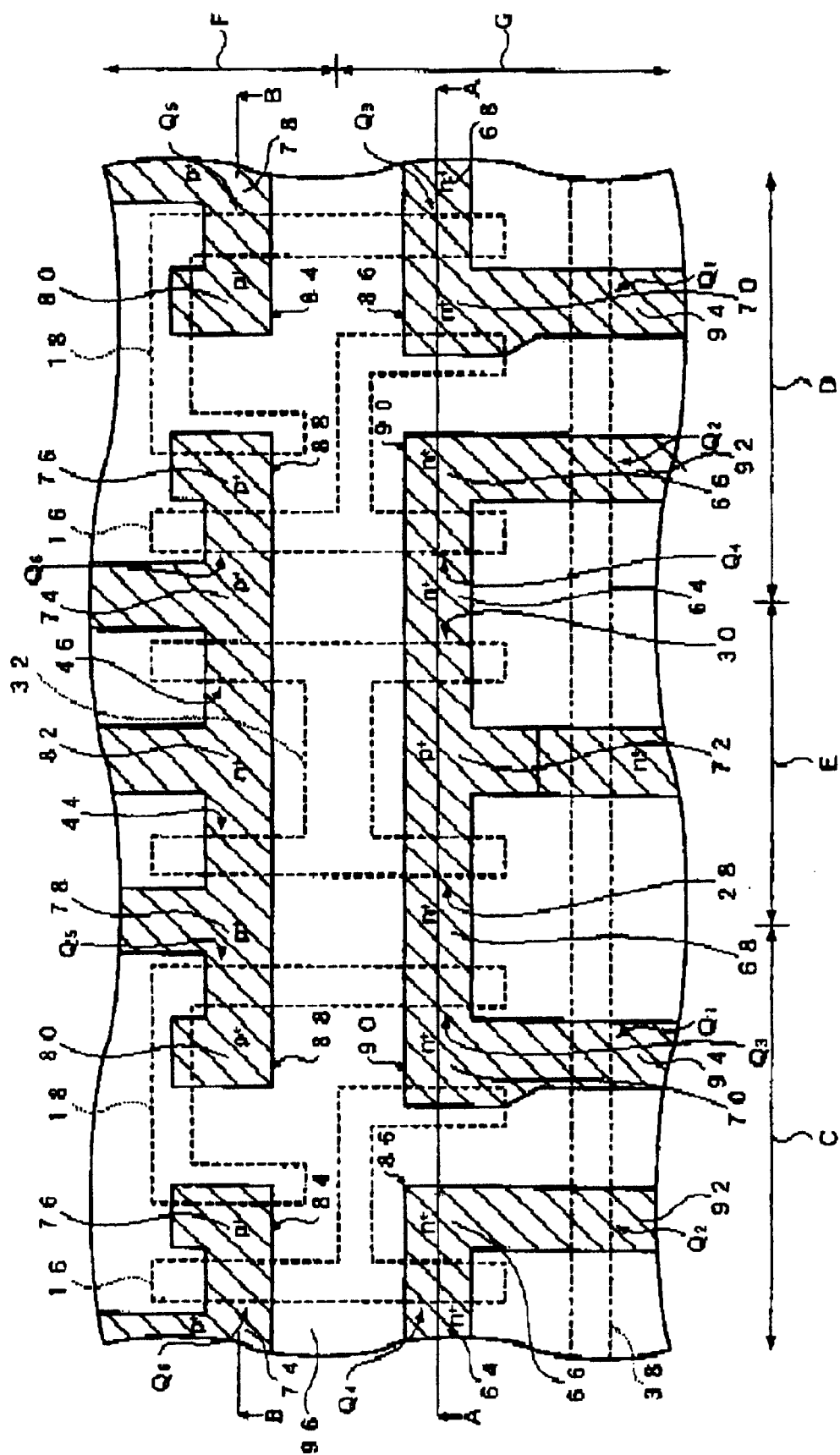
FIG. 3 is a plan view of a device element forming layer of memory cell arrays of a semiconductor memory device in accordance with one embodiment of the present invention.
Figure 4:
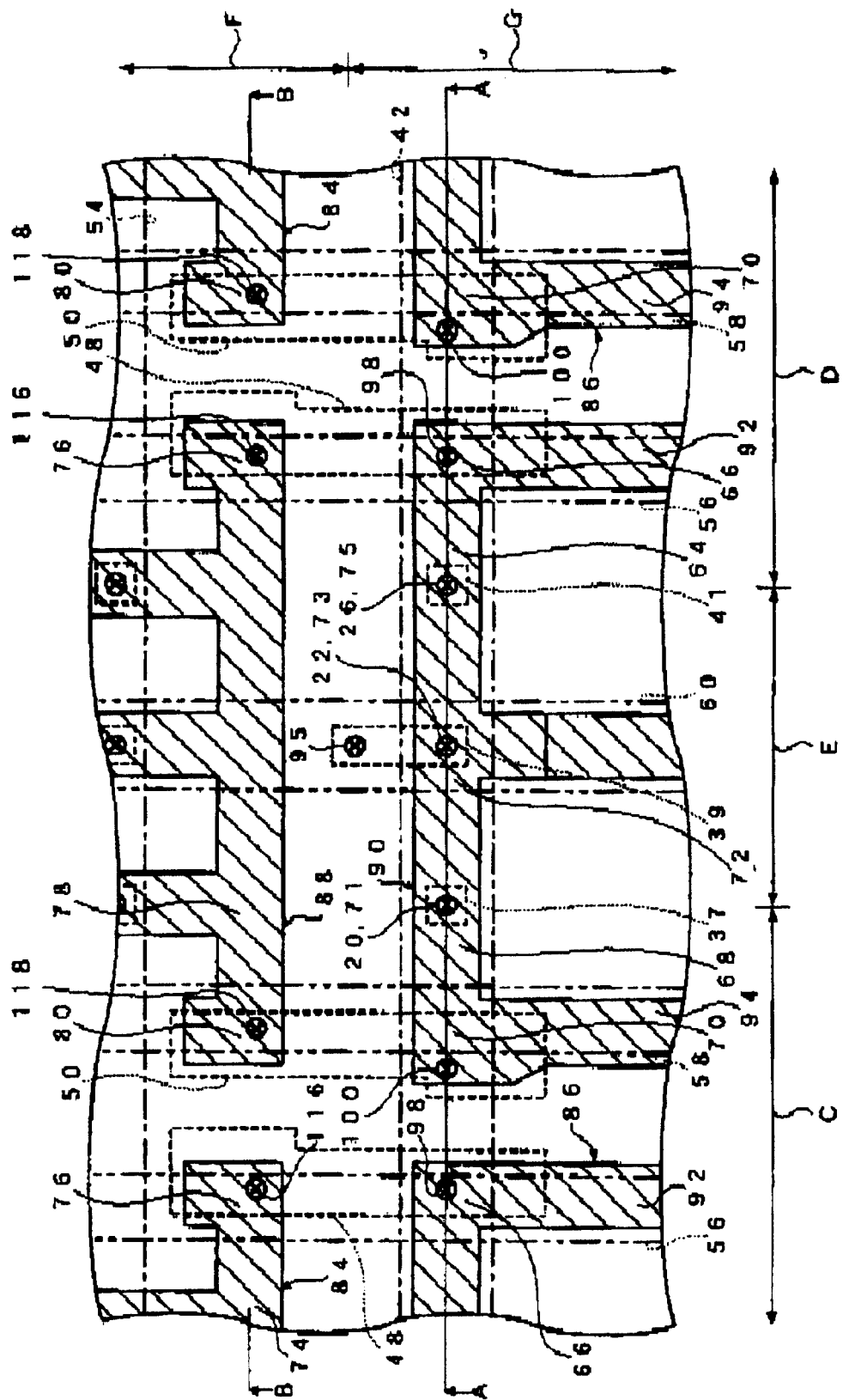
FIG. 4 is a plan view of a wiring layer of memory cell arrays of a semiconductor memory device in accordance with one embodiment of the present invention.

FIGS. 3 and 4 are plan views of portions of memory cell arrays of a semiconductor memory device in accordance with one embodiment of the present invention. The semiconductor memory device is an SRAM. FIG. 3 shows a device element-forming layer. FIG. 4 shows a wiring layer that is formed over the device element-forming layer shown in FIG. 3.

First, the structure shown in FIG. 3 will be described. FIG. 3 shows a first memory cell forming region C on the left-hand side in a main surface of a silicon substrate, a border region E in the center of the main surface of the silicon substrate, and a second memory cell forming region D on the right-hand side in the main surface of the silicon substrate. FIG. 3 also shows a p-channel transistor-forming region F (n-well region) in the upper side of the main surface of the silicon substrate, and a n-channel transistor-forming region G (p well region) in the lower side of the main surface of the silicon substrate.

The first memory cell-forming region C includes active regions 84, 86, 88 and 90. The active regions are separated by a LOCOS oxide film 96. A word line 38, a first conductive layer 16 and a second conductive layer 18 are formed over the first memory cell-forming region C. The word line 38, the first conductive layer 16 and the second conductive layer 18 are formed from polysilicon layers. The first conductive layer 16 is generally in the shape of a letter "h", and the second conductive layer 18 is generally in the shape of a figure "7".

The first conductive layer 16 extends from an area over the active region 84 to an area over the LOCOS oxide film 96. The first conductive layer 16 branches out over the LOCOS oxide film 96. One of them extends to an area over the active region 86. The other extends to an area over the active region 90. The first conductive layer 16 defines a gate electrode of a load transistor $Q_6$ over the active region 84. The first conductive layer 16 defines a gate electrode of a driver transistor $Q_4$ over the active region 86. The other branch of the first conductive layer 16 that extends over the active region 90 is electrically connected to a drain region 70 of the active region 90 by a contact layer 100 shown in FIG. 1 and FIG. 4.

Figure 2:
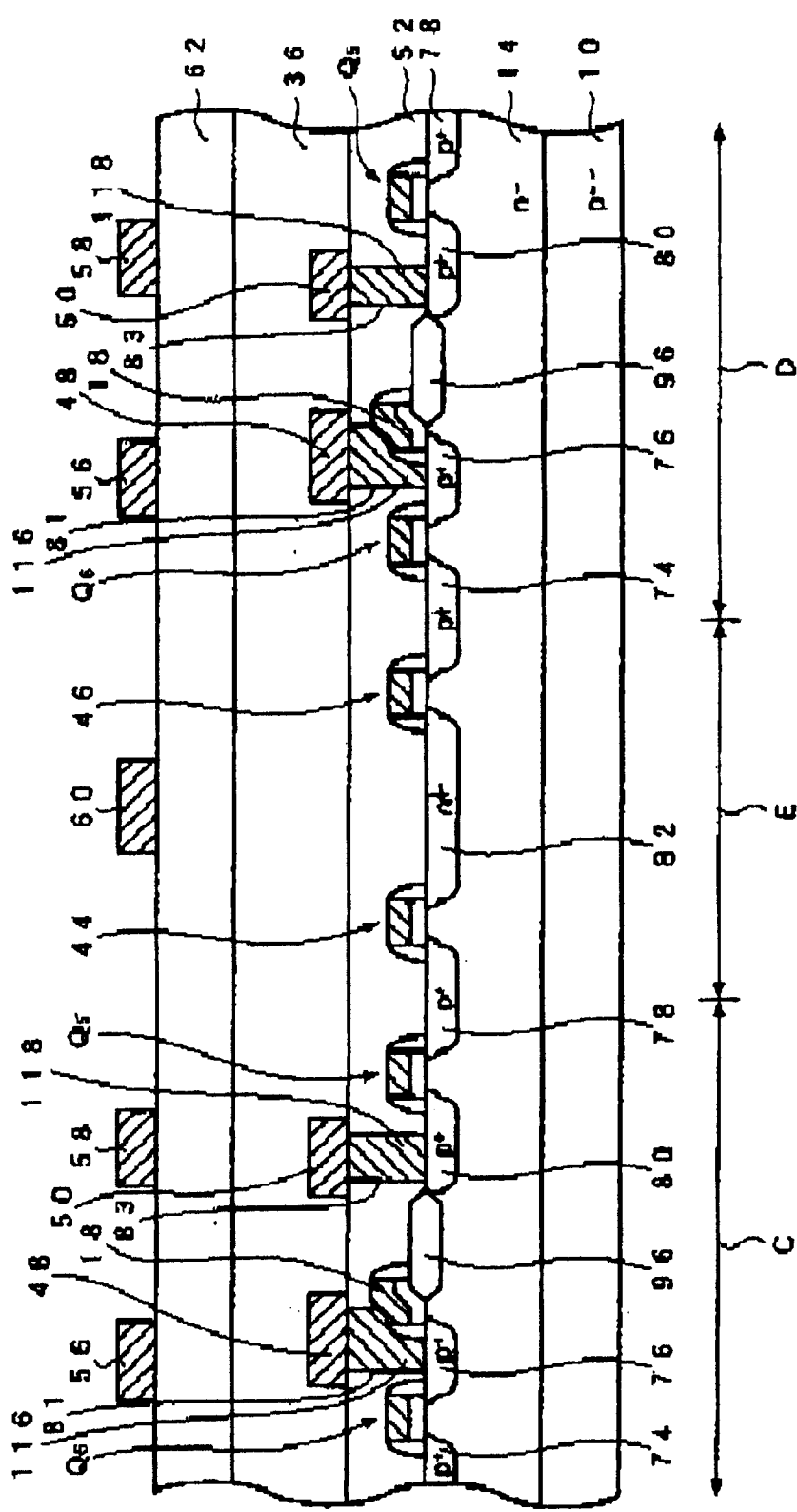
FIG. 2 is a cross-sectional view of the semiconductor memory device taken along a line B—B shown in FIGS. 3 and 4.

The second conductive layer 18 extends from an area over the active region 84 through the active region 88 to the active region 90. The second conductive layer 18 is electrically connected to a drain region 76 of the active region 84 by a first contact layer 116 as shown in FIG. 2 and FIG. 4. The second conductive layer 18 defines a gate electrode of a load transistor $Q_5$ over the active region 88. The second conductive layer 18 defines a gate electrode of a driver transistor $Q_3$ over the active region 90.

The word line 38 traverses the active regions 86 and 90. The word line 38 defines a gate electrode of a transfer transistor $Q_2$ over the active region 86. The word line 38 defines a gate electrode of a transfer transistor $Q_1$ over the active region 90.

One memory cell is formed by the transfer transistor $Q_1$, the transfer transistor $Q_2$, the driver transistor $Q_3$, the driver transistor $Q_4$, the load transistor $Q_5$ and the load transistor $Q_6$. A memory cell having the same structure is also formed in the second memory cell-forming region D.

The border region E will be described below. The border region E is provided between the first memory cell region C and the second memory cell region D. A predetermined number of memory cells are formed in each of the first and second memory cell regions. A well contact region is formed in the well in the border region E. The well contact region electrically connects to a wiring layer that fixes the voltage of the well for these memory cells.

The border region E includes the active regions 88 and 90. These active regions are separated from one another by the LOCOS oxide film. A third conductive layer 32 is formed over the border region E. The third conductive layer 32 is formed from a polysilicon layer. The third conductive layer 32 is in the shape of a letter "H". The third conductive layer 32 defines dummy gates of dummy elements 44 and 46 over the active region 88. The third conductive layer 32 defines dummy gates of dummy elements 28 and 30 over the active region 90.

The active region 90 in the border region E will be further described in detail. The active region 90 in the border region E is formed from an n-type impurity region (source region 68) that is commonly shared by the driver transistor $Q_3$, a p-type well contact region 72, and an n-type impurity region (source region 64) that is commonly shared by the driver transistor $Q_4$. As will be described below, the n-type impurity region and the p-type impurity region are formed by discriminatingly implanting ions, using the dummy elements 28 and 30 as masks.

The dummy elements 28 and 30 are provided to prevent the optical proximity effect and the loading effect. In other words, if the dummy elements 28 and 30 are not formed in the border region E, the pattern density in the border region E differs from the pattern density in the first and second memory cell regions C and D. As a consequence, the optical proximity effect or loading effect may occur near the border region E. Accordingly, a designed memory cell pattern is not obtained near the border region E. As a result, memory cells near the border region E may become defective.

FIG. 3 shows the structure as described above. Next, the structure shown in FIG. 4 will be described below. In FIG. 4, the first conductive layer 16, the second conductive layer 18, the third conductive layer 32 and the word line 38 shown in FIG. 3 are omitted. Wiring layers as described below are formed over the first conductive layer 16, the second conductive layer 18, the third conductive layer 32 and the word line 38. Local interconnect layers 48 and 50 are provided over the first memory cell-forming region C. The local interconnect layer 48 extends from an area over the active region 84 to an area over the active region 86. A drain region 66 of the driver transistor $Q_4$ and a drain region 76 of the load transistor $Q_6$ are electrically connected to each other by a first contact layer 98 disposed over the drain region 66, a first contact layer 116 disposed over the drain region 76 and the local interconnect layer 48 that connects the first contact layer 98 and the first contact layer 116.

The local interconnect layer 50 extends from an area over the active region 88 to an area over the active region 90. A drain region 70 of the driver transistor $Q_3$ and a drain region 80 of the load transistor $Q_5$ are electrically connected to each other by a first contact layer 100 disposed over the drain region 70, a first contact layer 118 disposed over the drain region 80 and the local interconnect layer 50 that connects the first contact layer 100 and the first contact layer 118. In the second memory cell forming region D, first conductive layers 98, 116, 100 and 118, and local interconnect layers 48 and 50 are provided in the same configuration.

First contact layers 20, 22 and 26 are located over the active region 90 in the border region E. The first contact layers 20, 22 and 26 are formed in the same steps as conducted to form the first contact layers 98, 116, 100 and 118. The first contact layers are conductive layers that are filled in contact holes. The conductive layer is formed from, for example, a barrier layer and a high melting point metal layer such as a W (tungsten) layer. A local interconnect layer has a layered structure having layers of high melting point metal, for example, Ti/TiN layers. The first contact layer 20 electrically connects to a source region 68. The first contact layer 22 electrically connects to a well contact region 72. The first contact layer 26 electrically connects to a source region 64. A local interconnect layer 37 is located over the first contact layer 20. The first contact layer 20 and the local interconnect layer 37 are electrically connected to each other. A local interconnect layer 39 is located over the first contact layer 22. The first contact layer 22 and the local interconnect layer 39 are electrically connected to each other. A local interconnect layer 41 is located over the first contact layer 26. The first contact layer 26 and the local interconnect layer 41 are electrically connected to each other.

Figure 1:
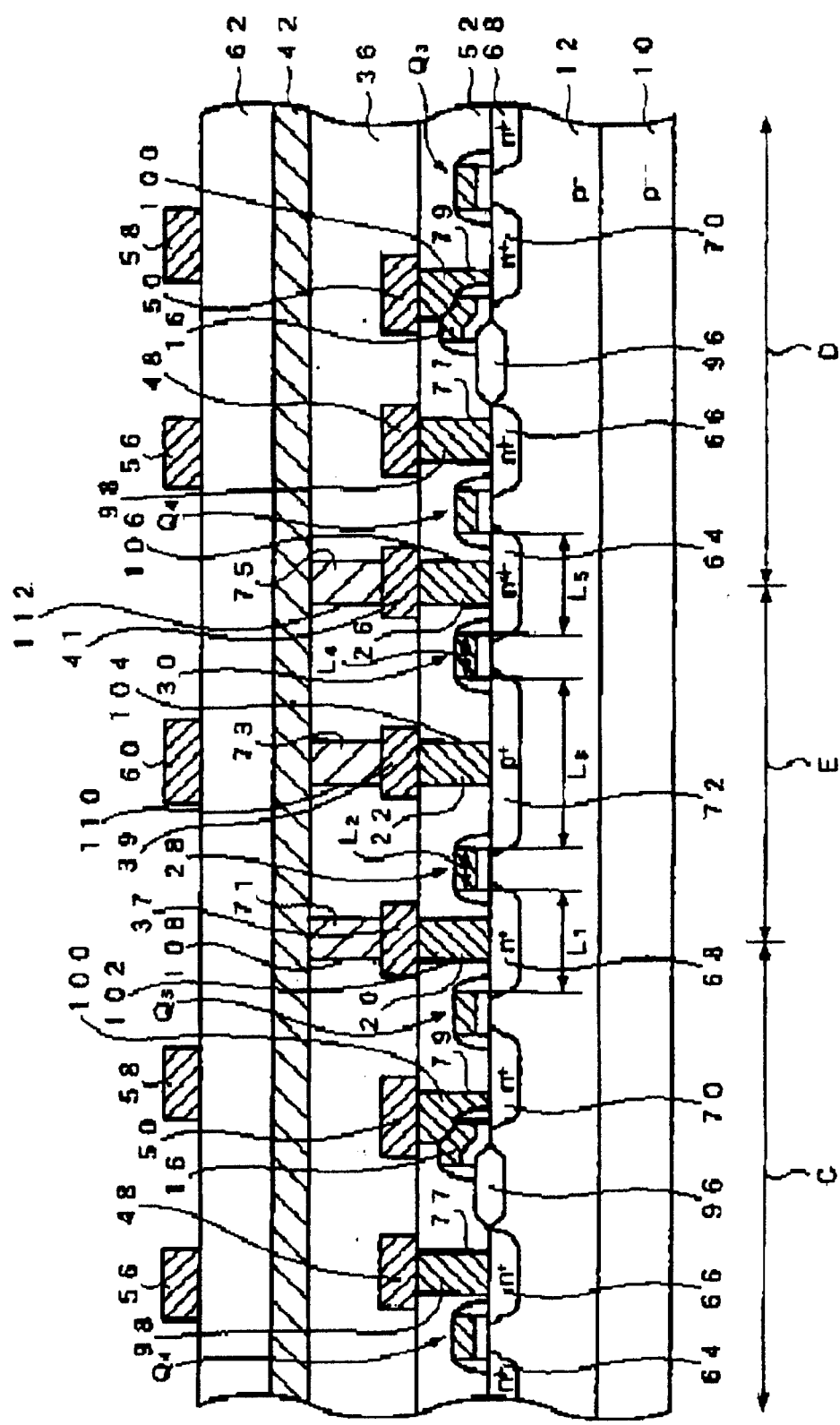
FIG. 1 is a cross-sectional view of a semiconductor memory device taken along a line A—A shown in FIGS. 3 and 4.

A power source line $V_{DD}$ 54 and a first ground line $V_{SS}$ 42 are located over the local interconnect layers 37, 39 and 41. The power source line $V_{DD}$ 54 and the first ground line $V_{SS}$ 42 traverse the first memory cell region C, the border region E and the second memory cell region D. As shown in FIG. 1, the first ground line $V_{SS}$ 42 and the local interconnect layer 37 are electrically connected to each other by the second conductive layer 71. The first ground line $V_{SS}$ 42 and the local interconnect layer 39 are electrically connected to each other by the second conductive layer 73. The first ground line $V_{SS}$ 42 and the local interconnect layer 41 are electrically connected to each other by the second conductive layer 75. The power source line $V_{DD}$ 54 and the first ground line $V_{SS}$ 42 are composed of aluminum or an aluminum alloy containing aluminum and copper added thereto.

Bit lines 56 and 58 and a second ground line $V_{SS}$ 60 are located over the power source line $V_{DD}$ 54 and the first ground line $V_{SS}$ 42. The bit lines 56 and 58 are located on the first memory cell-forming region C. The bit line extends from an area over the active region 84 to an area over the active region 86. The bit line 56 and a drain region 92 of the transfer transistor $Q_2$ are electrically connected to each other by a contact layer and a local interconnect layer (not shown). The bit line 58 extends from an area over the active region 88 to an area over the active region 90. The bit line 58 and a drain region 94 of the transfer transistor $Q_1$ are electrically connected to each other by a contact layer and a local interconnect layer (not shown). The second memory cell-forming region D also has bit lines 56 and 58 in the same structure.

The second ground line $V_{SS}$ 60 is located over the border region E. The second ground line $V_{SS}$ 60 extends from an area over the active region 88 to an area over the active region 90. The second ground line $V_{SS}$ 60 is electrically connected to the first ground line $V_{SS}$ 42 through a third contact layer 95 and the local interconnect layer 39.

FIG. 1 is a cross-sectional view taken along a line A—A of the semiconductor memory device shown in FIGS. 3 and 4. Structures that are not described with reference to FIGS. 3 and 4 will be described below. As shown in FIG. 1, a p⁻type well 12 is formed in a p⁻⁻type silicon substrate 10.

The border region E has a length that is equivalent to the sum of one half of the length $L_1$ between one of side sections of a gate electrode of the driver transistor $Q_3$ on the side of the dummy element 28 and one of side sections of the dummy element 28 on the side of the gate electrode of the driver transistor $Q_3$, the length $L_2$ of the dummy element 28, the length $L_3$ between one of the side sections of the dummy element 28 on the side of the dummy element 30 and one of side sections of the dummy element 30 on the side of the dummy element 28, the length $L_4$ of the dummy element 30, and one half of the length $L_5$ between one of side sections of a gate electrode of the driver transistor $Q_4$ on the side of the dummy element 30 and one of the side sections of the dummy element 30 on the side of the gate electrode of the driver transistor $Q_4$.

The length $L_1$ is, for example, 0.25–0.3 μm; the length $L_2$ is, for example, 0.2–0.3 μm; the length $L_3$ is, for example, 0.5–0.7 μm; the length $L_4$ is, for example, 0.2–0.3 μm; and the length $L_5$ is, for example, 0.25–0.3 μm.

Alternatively, the length of the border region E may be defined by a length equivalent the sum of one half of the length of the source region 68, the length of the dummy element 28, the length of the well contact region 72, the length of the dummy element 30, and one half of the length of the source region 64.

A first dielectric layer 52 is formed over the p⁻⁻type silicon substrate 10 and covers the driver transistor $Q_3$, the driver transistor $Q_4$, the first conductive layer 16, the dummy element 28 and the dummy element 30. Contact holes 77 are formed in the first dielectric layer 52. The contact holes 77 are filled with first contact layers 98. The local interconnect layer 48 is formed on the first dielectric layer 52. The local interconnect layer 48 is electrically connected to the drain region 66 through the first contact layer 98.

Contact holes 79 are formed in the first dielectric layer 52. The contact holes 79 are filled with first contact layers 100. The local interconnect layer 50 is formed on the first dielectric layer 52. The local interconnect layer 50 is electrically connected to the drain region 70 and the first dielectric layer 16 through the first contact layer 100.

A contact hole 102 is formed in the first dielectric layer 52. The contact hole 102 is filled with a first contact layer 20. The local interconnect layer 37 is formed on the first dielectric layer 52. The local interconnect layer 37 is electrically connected to the source region 68 through the first contact layer 20. A contact hole 104 is formed in the first dielectric layer 52. The contact hole 104 is filled with a first contact layer 22. The local interconnect layer 39 is formed on the first dielectric layer 52. The local interconnect layer 39 is electrically connected to the well contact region 72 through the first contact layer 22.

A contact hole 106 is formed in the first dielectric layer 52. The contact hole 106 is filled with a first contact layer 26. The local interconnect layer 41 is formed on the first dielectric layer 52. The local interconnect layer 41 is electrically connected to the source region 64 through the first contact layer 26.

A second dielectric layer 36 is formed on the first dielectric layer 52 and covers the local interconnect layers 48, 50, 37, 39 and 41. A through hole 108 is formed in the second dielectric layer 36. The through hole 108 is filled with a second contact layer 71. The second contact layer 71 is electrically connected to the local interconnect layer 37. A through hole 110 is formed in the second dielectric layer 36. The through hole 110 is filled with a second contact layer 73. The second contact layer 73 is electrically connected to the local interconnect layer 39. A through hole 112 is formed in the second dielectric layer 36. The through hole 112 is filled with a second contact layer 75. The second contact layer 75 is electrically connected to the local interconnect layer 41.

The first ground line $V_{SS}$ 42 is located over the second dielectric layer 36. The first ground line $V_{SS}$ 42 electrically connects to the second contact layers 71, 73 and 75.

A third dielectric layer 62 is formed on the second dielectric layer 36 and covers the first ground line $V_{SS}$ 42. The bit lines 56 and 58 and the second ground line $V_{SS}$ 60 are located over the third dielectric layer 62.

FIG. 2 is a cross-sectional view taken along a line B—B of the semiconductor memory device shown in FIGS. 3 and 4. Structures that have not been described with reference to FIGS. 3 and 4 will be described below. As shown in FIG. 2, an n⁻type well 14 is formed in the p⁻⁻type silicon substrate 10. The length of the border region E is the same as that of the border region E described with reference to FIG. 1.

The first dielectric layer 52 is formed over the p⁻⁻type silicon substrate 10, and covers the load transistor $Q_5$, the load transistor $Q_6$, the second conductive layer 18, the dummy element 44 and the dummy element 46. A contact hole 81 is formed in the first dielectric layer 52. The contact hole 81 is filled with a first contact layer 116. The local interconnect layer 48 is formed on the first dielectric layer 52. The local interconnect layer 48 is electrically connected to the drain region 76 and the second conductive layer 18 through the first contact layer 116. A contact hole 83 is formed in the first dielectric layer 52. The contact hole 83 is filed with a first contact layer 118. The local interconnect layer 50 is formed on the first dielectric layer 52. The local interconnect layer 50 is electrically connected to the drain region 80 through the first contact layer 118.

The second dielectric layer 36 is formed on the first dielectric layer 52 and covers the local interconnect layers 48 and 50. The third dielectric layer 62 is formed over the second dielectric layer 36. The bit lines 56 and 58 and the second ground line $V_{SS}$ 60 are located on the third dielectric layer 62.

Figure 22:
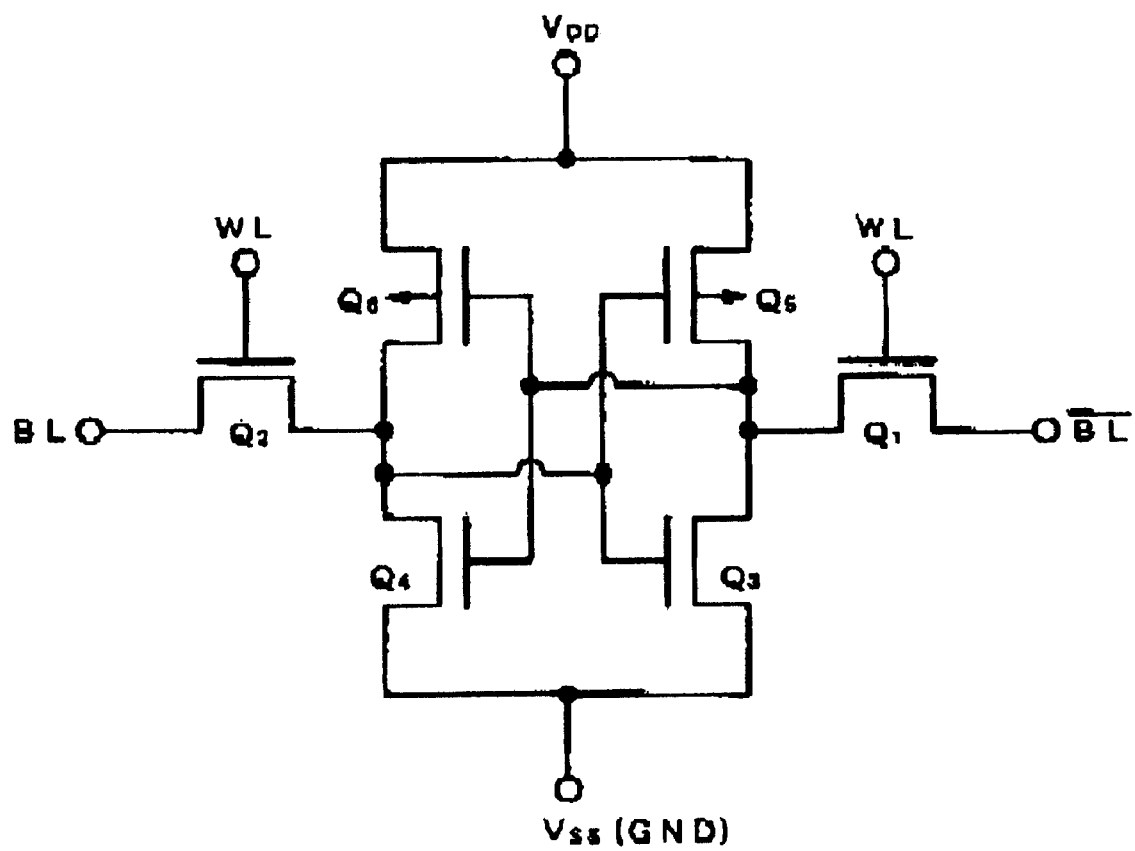
FIG. 22 is an equivalent circuit of a semiconductor memory device in accordance with one embodiment of the present invention.

FIG. 22 shows an equivalent circuit diagram of the SRAM memory cell described with reference to FIG. 1–FIG. 4. An inverter is formed from the load transistor $Q_5$ and the driver transistor $Q_3$, and an inverter is formed from the load transistor $Q_6$ and the driver transistor $Q_4$. The inverters are electrically connected to each other to compose a flip-flop.

One of the nodes of the transfer transistor $Q_2$ electrically connects to the inverter that is composed of the load transistor $Q_6$ and the driver transistor $Q_4$. The other of the nodes of the transfer transistor $Q_2$ electrically connects to the bit line. The gate electrode of the transfer transistor $Q_2$ electrically connects to the word line 38.

The source regions of the load transistors $Q_5$ and $Q_6$ electrically connect to the power source line $V_{DD}$. The source regions of the driver transistors $Q_3$ and $Q_4$ electrically connect to the ground line $V_{SS}$.

One of the nodes of the transfer transistor $Q_1$ electrically connects to the inverter that is composed of the load transistor $Q_5$ and the driver transistor $Q_3$. The other of the nodes of the transfer transistor $Q_1$ electrically connects to the bit line. The gate electrode of the transfer transistor $Q_1$ electrically connects to the word line.

A method for manufacturing a semiconductor memory device in accordance with one embodiment will be described with reference to plan views and cross-sectional views taken along a line A—A of the plan views.

Figure 5:
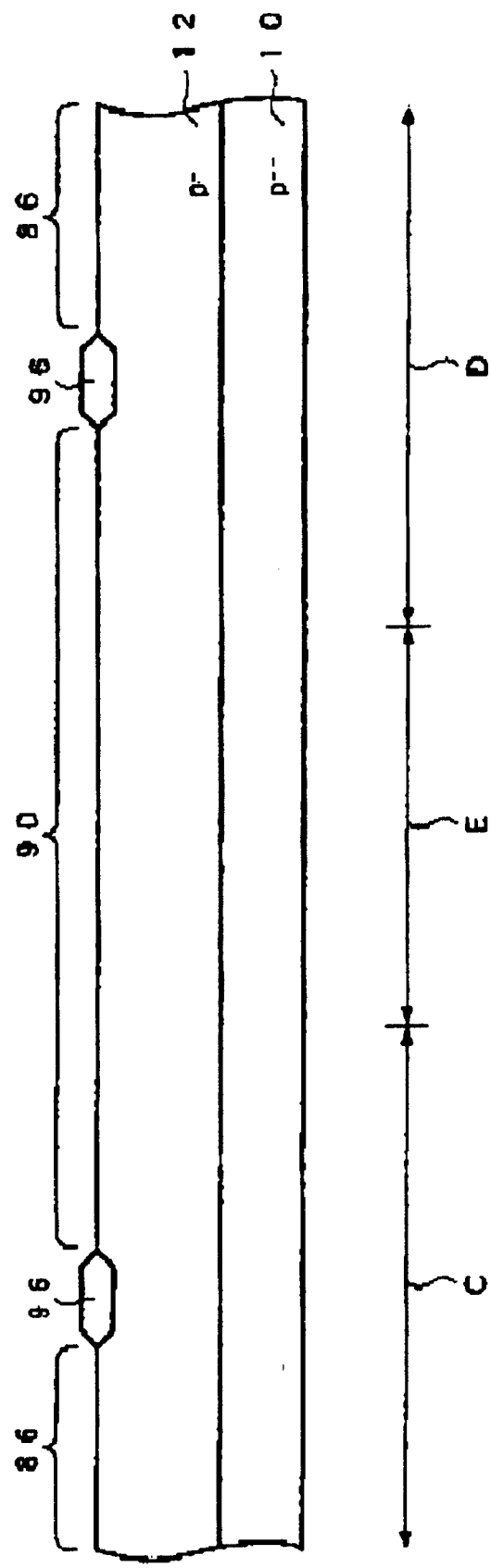
FIG. 5 is a cross-sectional view of a silicon substrate in a first step in a method for manufacturing a semiconductor memory device in accordance with one embodiment of the present invention.
Figure 6:
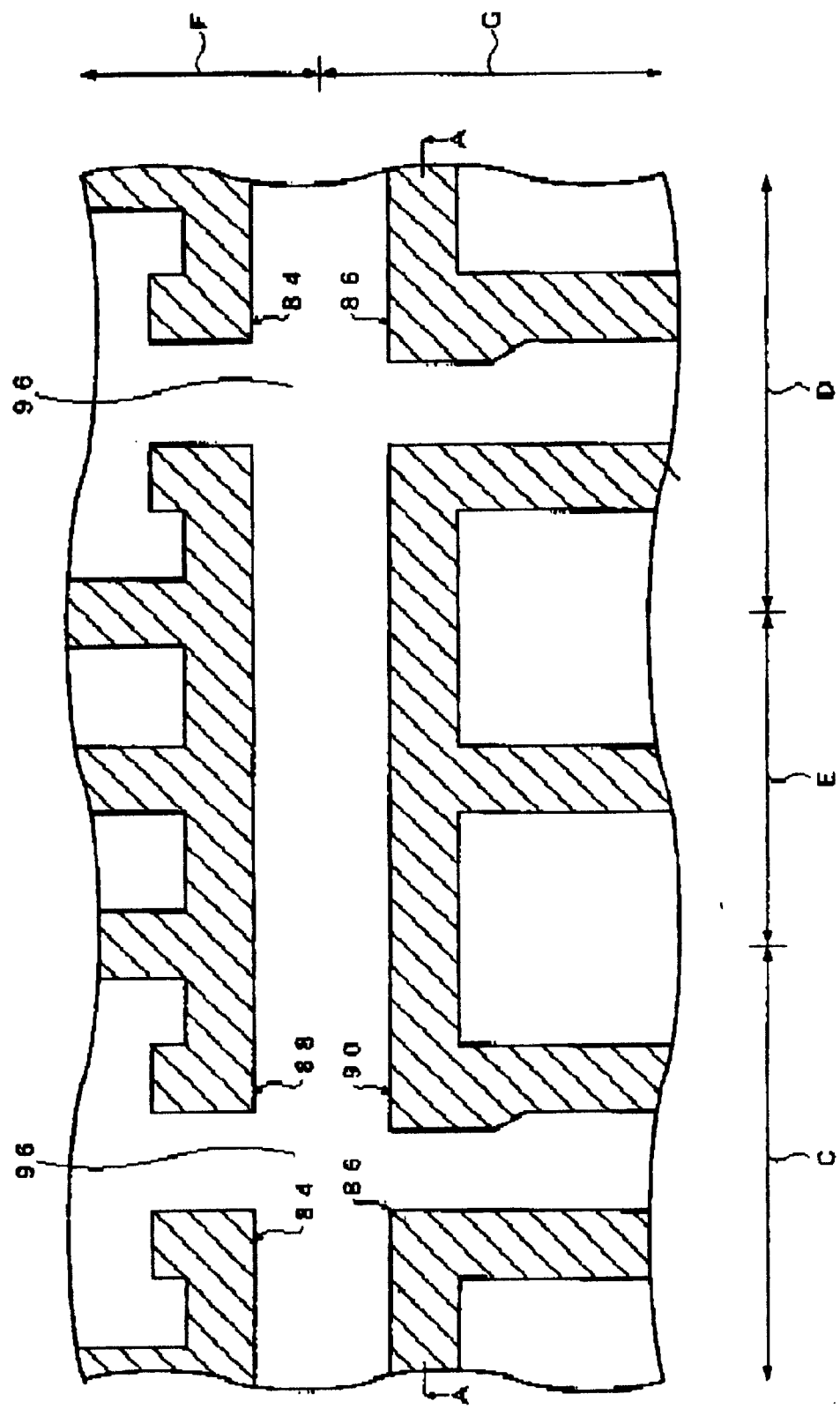
FIG. 6 is a plan view of a silicon substrate in a first step in a method for manufacturing a semiconductor memory device in accordance with one embodiment of the present invention.

As shown in FIGS. 5 and 6, a p⁻type well 12 is formed in a p⁻⁻type silicon substrate 10. The p⁻type well 12 can be formed by a high-energy ion implantation, for example. The well formed by such a method is called a retrograded well. The energy for the ion implantation is, for example, 1.0–1.4 MeV. The dose of the ion implantation is, for example, $8.0 \times 10^{12} - 1.2 \times 10^{13}/cm^2$. The LOCOS oxide film 96 is formed on the main surface of the p⁻⁻type silicon substrate 10 by a selective oxidation method, for example. Areas other than the areas of the main surface of the p⁻⁻type silicon substrate 10 where the LOCOS oxide film 96 is formed becomes the active regions 84, 86, 88 and 90. It is noted that a semi-recess LOCOS oxide film or a shallow trench (0.4–0.8 μm deep) may be formed instead of the LOCOS oxide film.

Figure 7:
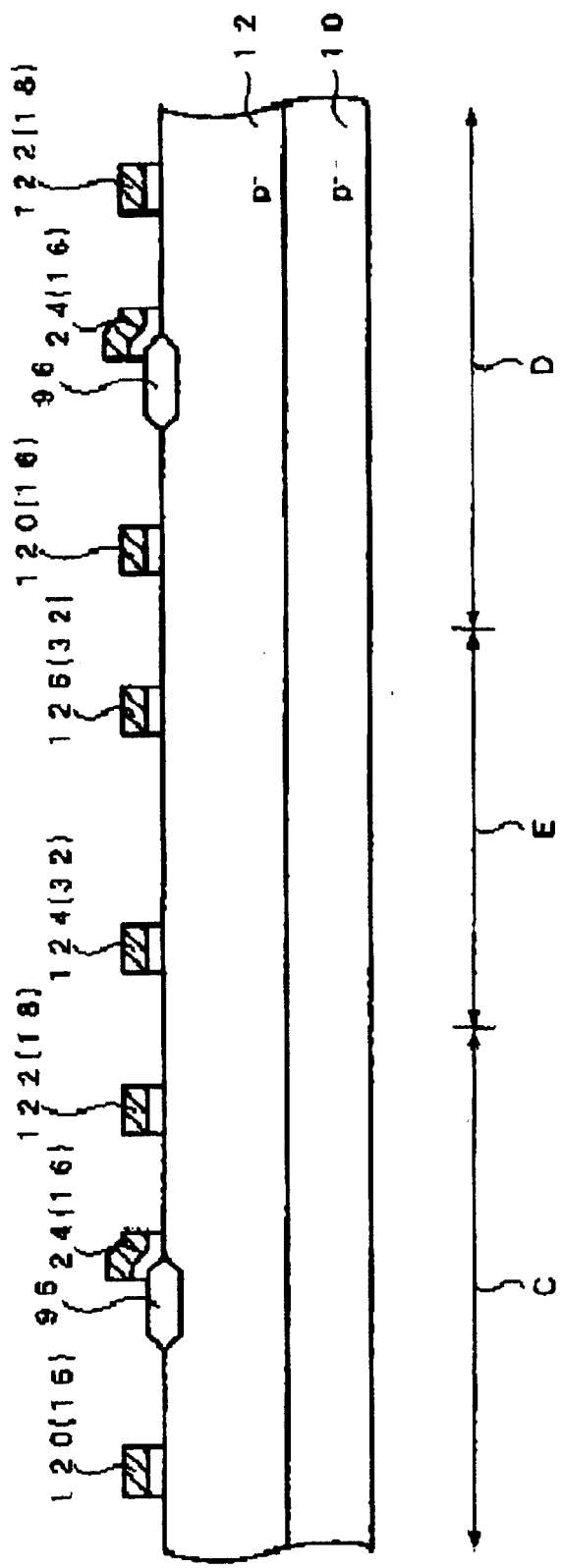
FIG. 7 is a cross-sectional view of a silicon substrate in a second step in a method for manufacturing a semiconductor memory device in accordance with one embodiment of the present invention.
Figure 8:
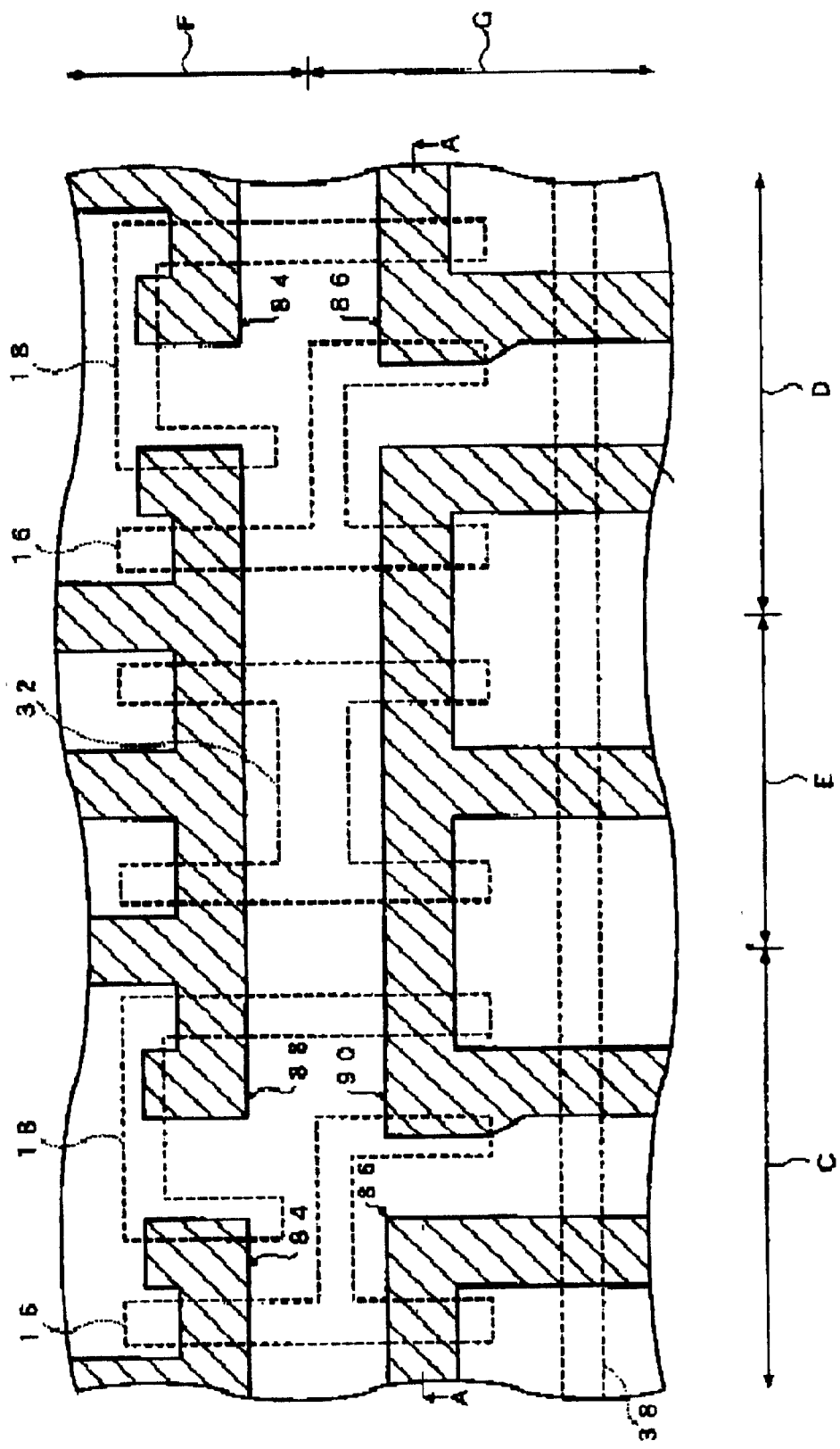
FIG. 8 is a plan view of a silicon substrate in a second step in a method for manufacturing a semiconductor memory device in accordance with one embodiment of the present invention.

As shown in FIGS. 7 and 8, a thermal oxidation film is formed to a film thickness of about 5–6 nm over the entire main surface of the p⁻⁻type silicon substrate 10 by a thermal oxidation, for example. Then, for example, a polycrystal silicon layer is formed on the thermal oxidation film to a thickness of 250–350 nm, using a CVD method. Alternatively, a silicide layer may be formed on the polycrystal silicon layer. Then, the polycrystal silicon layer is patterned, using for example photolithography and etching. As a result, the first conductive layer 16, the second conductive layer 18, the third conductive layer 32 and the word line 38 are formed. Referring to FIG. 7, the first conductive layer 16 appears as the gate electrode 120 of the driver transistor $Q_4$ and the wiring layer 24. The second conductive layer 18 appears as the gate electrode 122 of the driver transistor $Q_3$. The third conductive layer 32 appears as the dummy gates 124 and 126 of the dummy elements 28 and 30.

Figure 9:
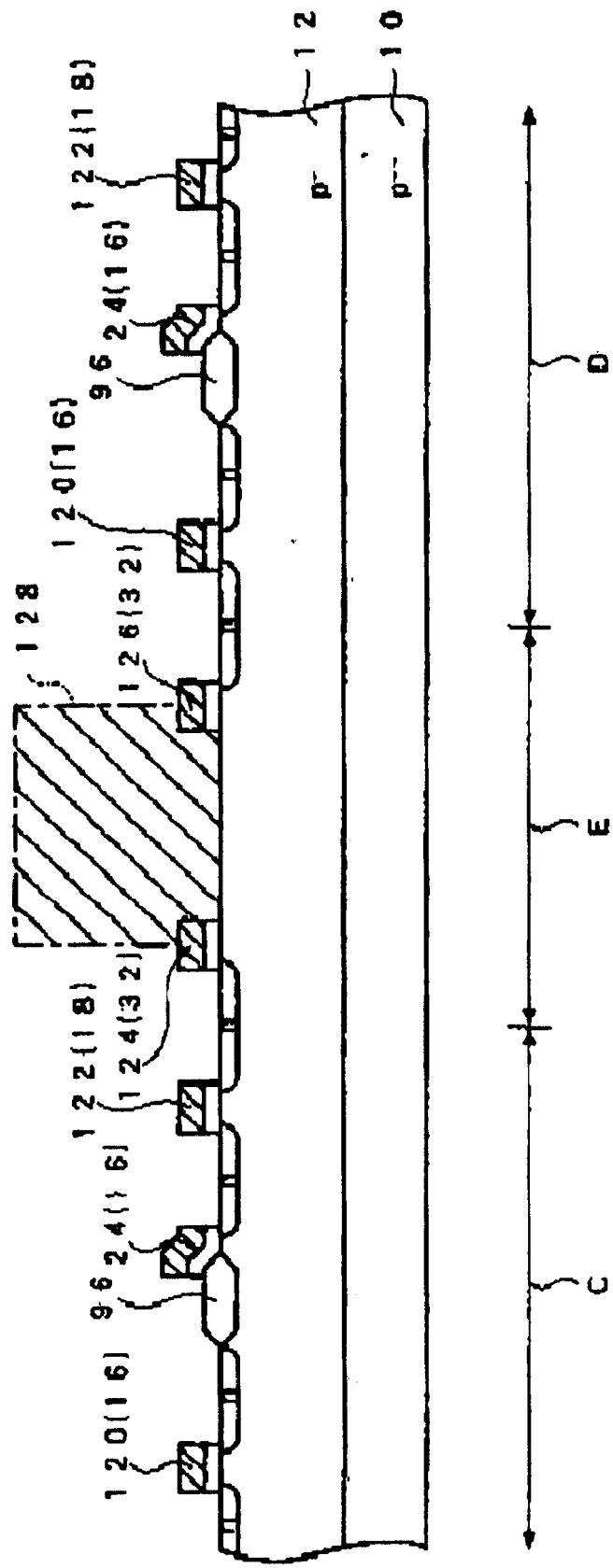
FIG. 9 is a cross-sectional view of a silicon substrate in a third step in a method for manufacturing a semiconductor memory device in accordance with one embodiment of the present invention.
Figure 10:
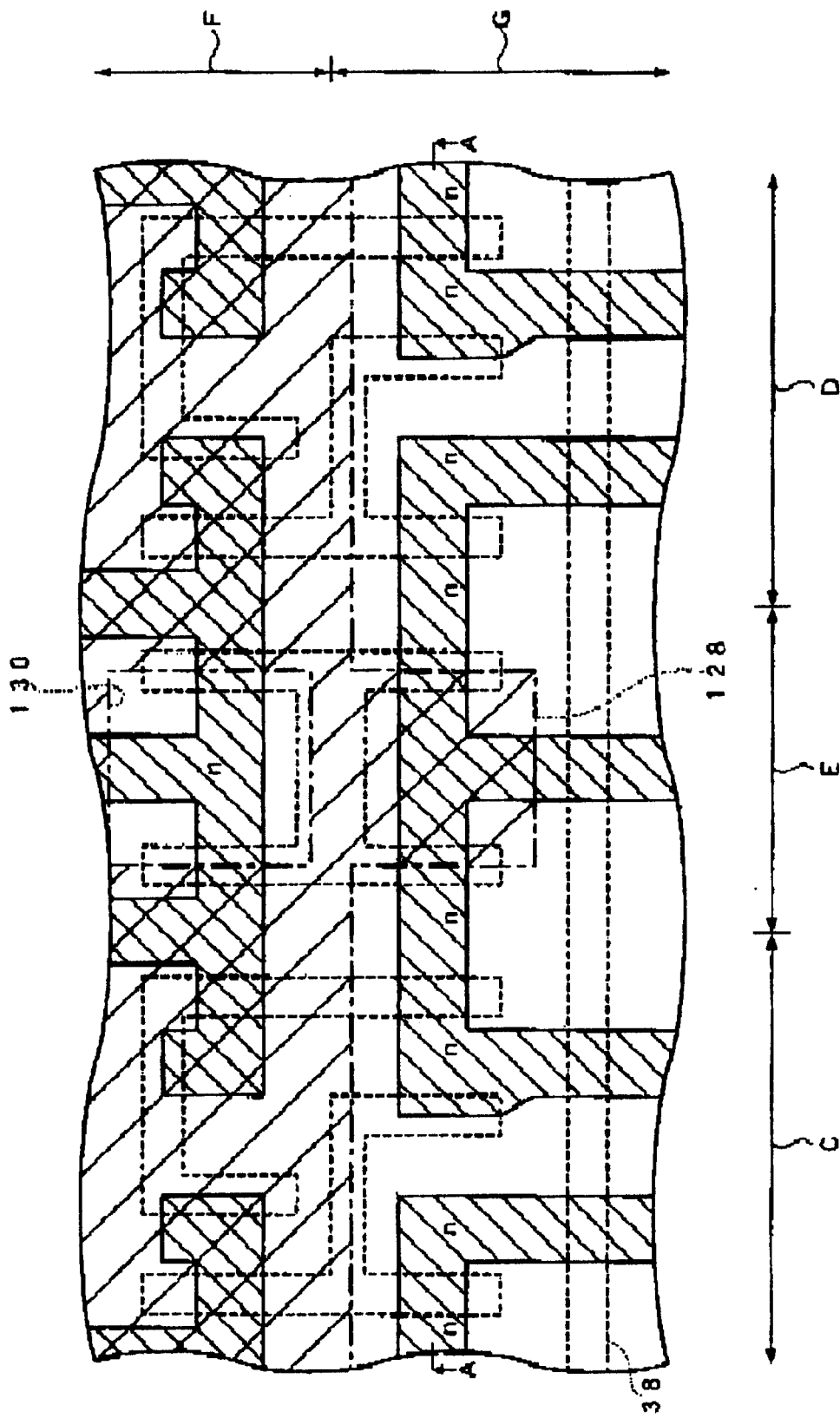
FIG. 10 is a plan view of a silicon substrate in a third step in a method for manufacturing a semiconductor memory device in accordance with one embodiment of the present invention.

As shown in FIGS. 9 and 10, a resist 128 is formed on the entire main surface of the p⁻⁻type silicon substrate 10. The resist 128 is exposed to light to pattern the resist 128. The p-channel transistor-forming region F is covered by the resist 128. However, an opening 130 is provided in a region where the well contact region is formed. The n-channel transistor-forming region G is exposed. However, an area where the well contact region is formed is covered by the resist 128.

Phosphorous ions are implanted in the well 12 using the resist 128, the LOCOS oxide film 96, the gate electrode 120, the wiring layer 24, the gate electrode 122, the dummy gate 124 and dummy gate 126 as masks. The energy for the ion implantation is, for example, 25–30 KeV. The dose of ions for the ion implantation is, for example, $8.0 \times 10^{13} - 1.2 \times 10^{14}/cm^2$. As a result, an n-type low concentration region is formed in the well 12. The n-type low concentration region becomes to be a low concentration region of the source region of the LDD structure or a low concentration region of the drain region of the LDD structure. An n-type low concentration region is also formed in the p-channel transistor-forming region F by the ion implantation. The n-type low concentration region becomes to be a well contact region.

Figure 11:
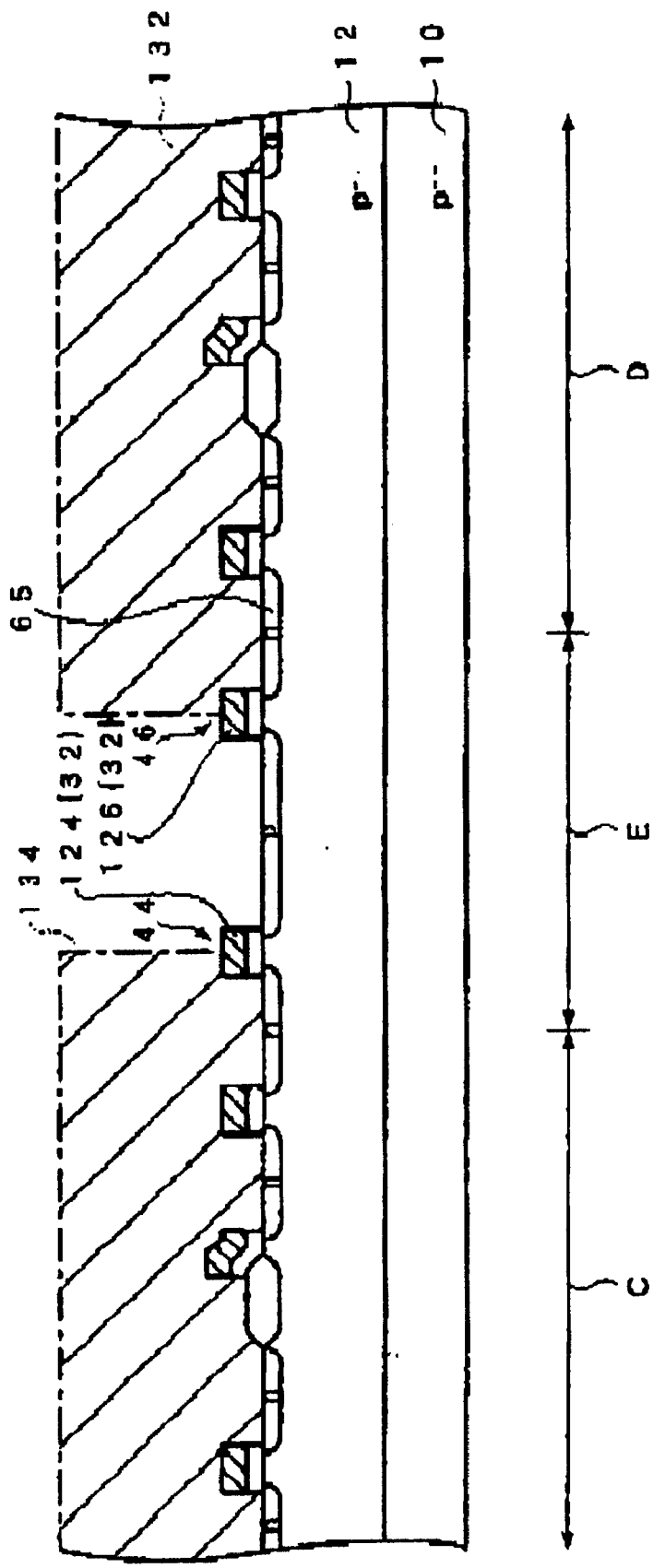
FIG. 11 is a cross-sectional view of a silicon substrate in a fourth step in a method for manufacturing a semiconductor memory device in accordance with one embodiment of the present invention.
Figure 12:
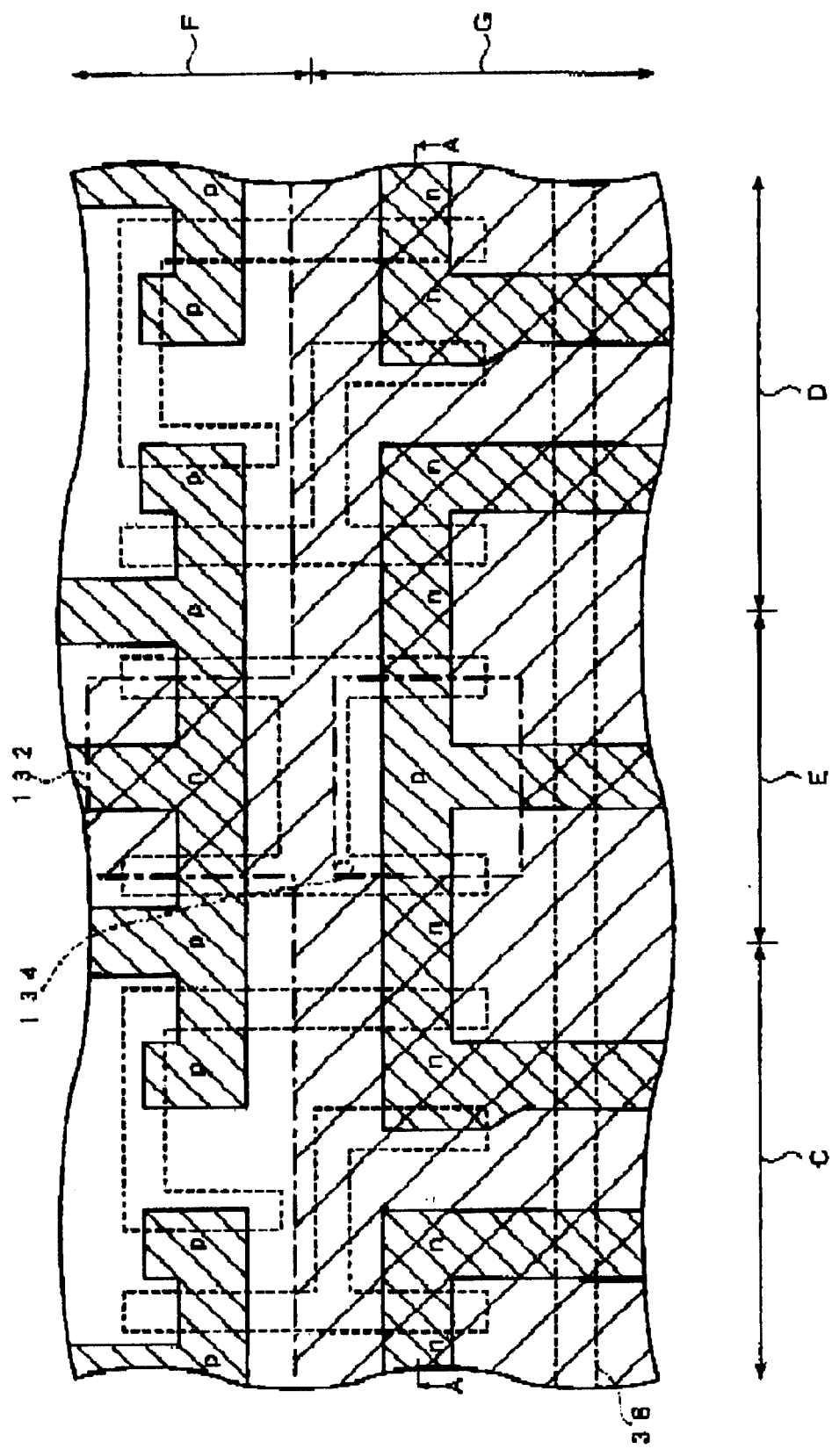
FIG. 12 is a plan view of a silicon substrate in a fourth step in a method for manufacturing a semiconductor memory device in accordance with one embodiment of the present invention.

As shown in FIGS. 11 and 12, a resist 132 is formed on the entire main surface of the p⁻⁻type silicon substrate 10. The resist 132 is exposed to light to pattern the resist 132. The n-channel transistor-forming region G is covered by the resist 132. However, an opening 134 is provided in an area in the border region E where the well contact region is formed. The p-channel transistor-forming region F is exposed. However, an area where the well contact region is formed is covered by the resist 132.

$BF_2$ ions are implanted in the well 12 using the resist 132 and the like. The energy for the ion implantation is, for example, 20–25 KeV. The dose of ions for the ion implantation is, for example, $8.0 \times 10^{13} - 1.2 \times 10^{14}/cm^2$. As a result, a p-type low concentration region is formed in the well 12. The p-type low concentration region becomes to be a well contact region. A p-type low concentration region is also formed in the p-channel transistor-forming region F by the ion implantation. The p-type low concentration region becomes to be a low concentration region of the source region of the LDD structure or a low concentration region of the drain region of the LDD structure.

Figure 13:
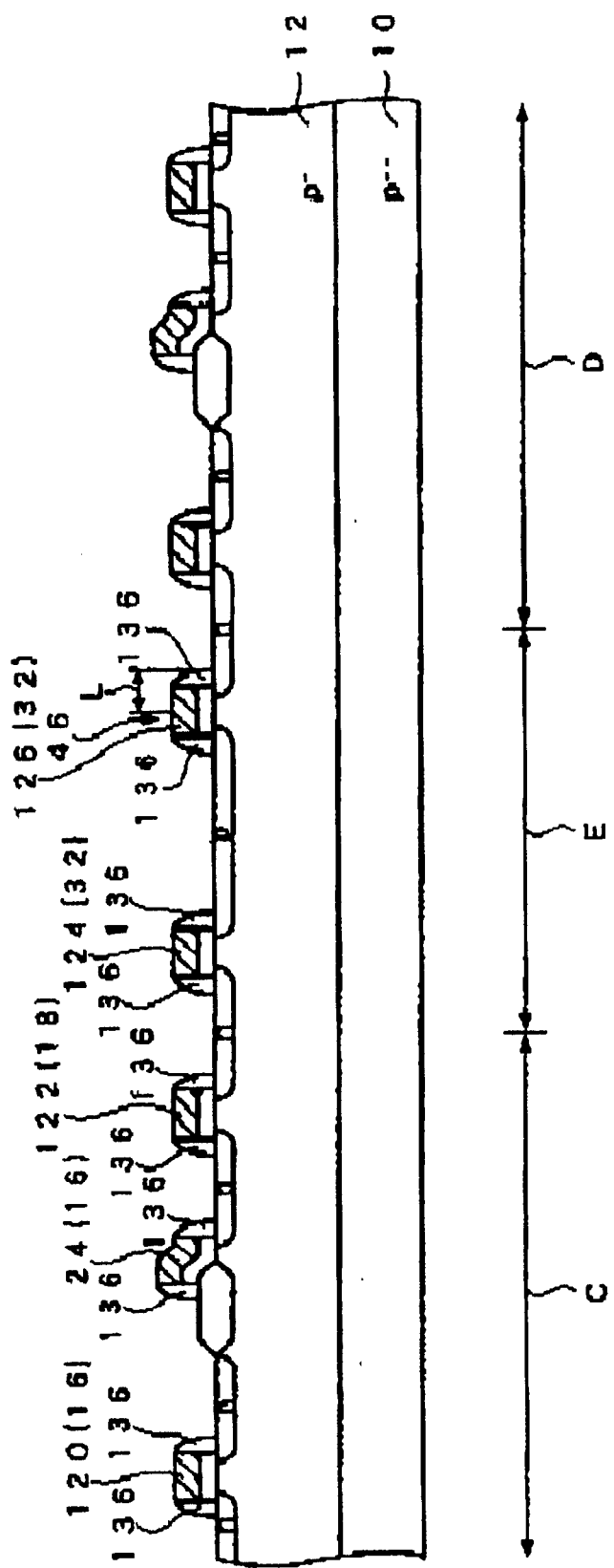
FIG. 13 is a cross-sectional view of a silicon substrate in a fifth step in a method for manufacturing a semiconductor memory device in accordance with one embodiment of the present invention.
Figure 14:
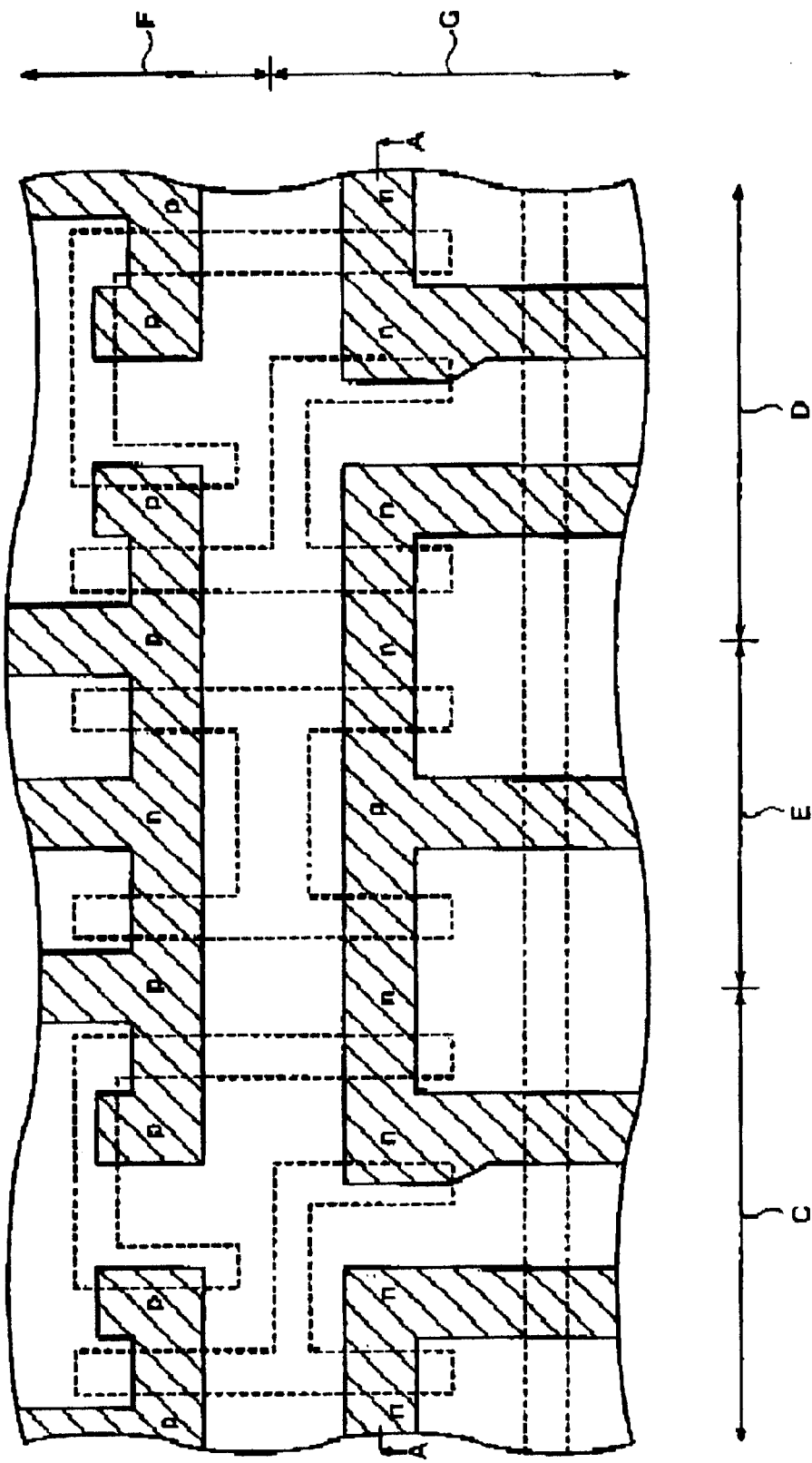
FIG. 14 is a plan view of a silicon substrate in a fifth step in a method for manufacturing a semiconductor memory device in accordance with one embodiment of the present invention.

As shown in FIGS. 13 and 14, side wall dielectric films are formed on side surfaces of the gate electrode 120, side surfaces of the wiring layer 24, side surfaces of the gate electrode 122, side surfaces of the dummy gate 124 and side surfaces of the dummy gate 126. The value L equivalent to one half of the length of the dummy element 46 is greater than an alignment error that may occur at the time of forming a resist 142, which will be described with reference to FIG. 17. The resist 142 serves as a mask when ion implantation is conducted to form source and drain regions of p-channel transistors. In this example, the value L equivalent to one half of the length of the dummy element 46 equals to one half of the length of the dummy gate 126 plus the length of the side wall dielectric film 136.

Figure 15:
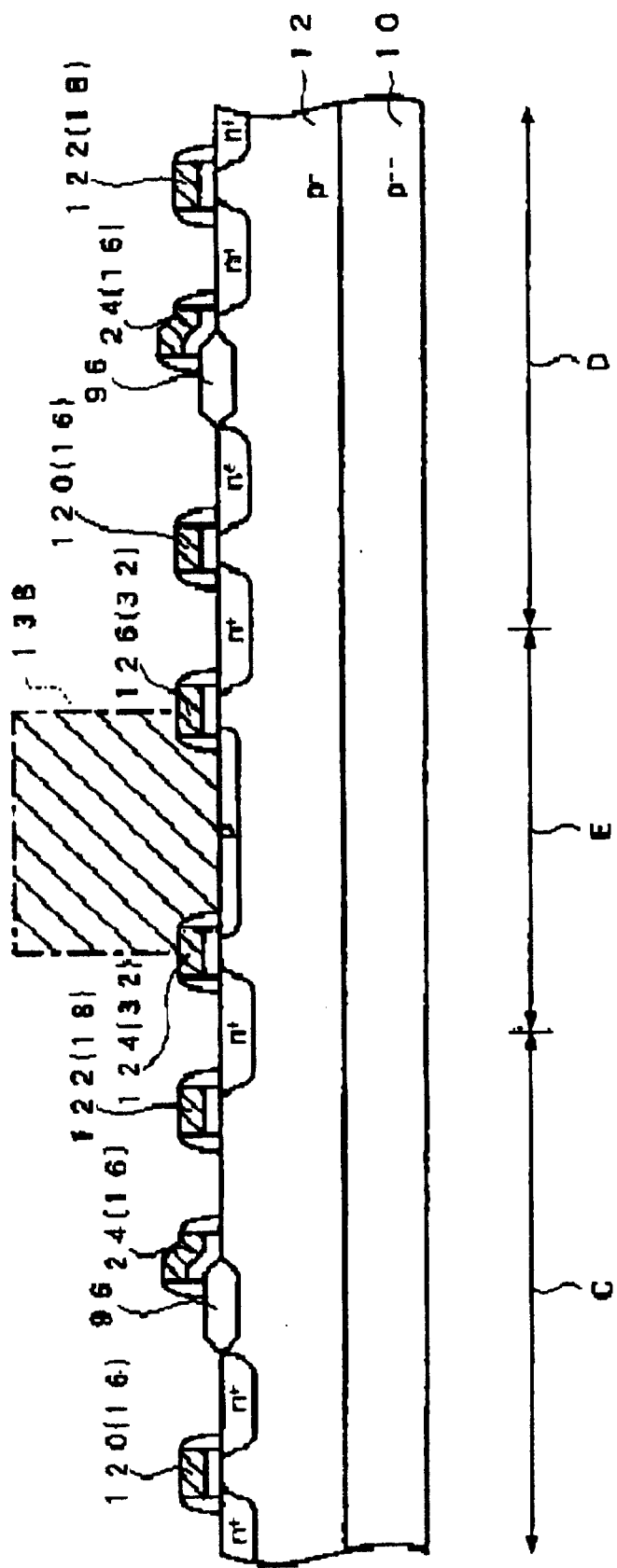
FIG. 15 is a cross-sectional view of a silicon substrate in a sixth step in a method for manufacturing a semiconductor memory device in accordance with one embodiment of the present invention.
Figure 16:
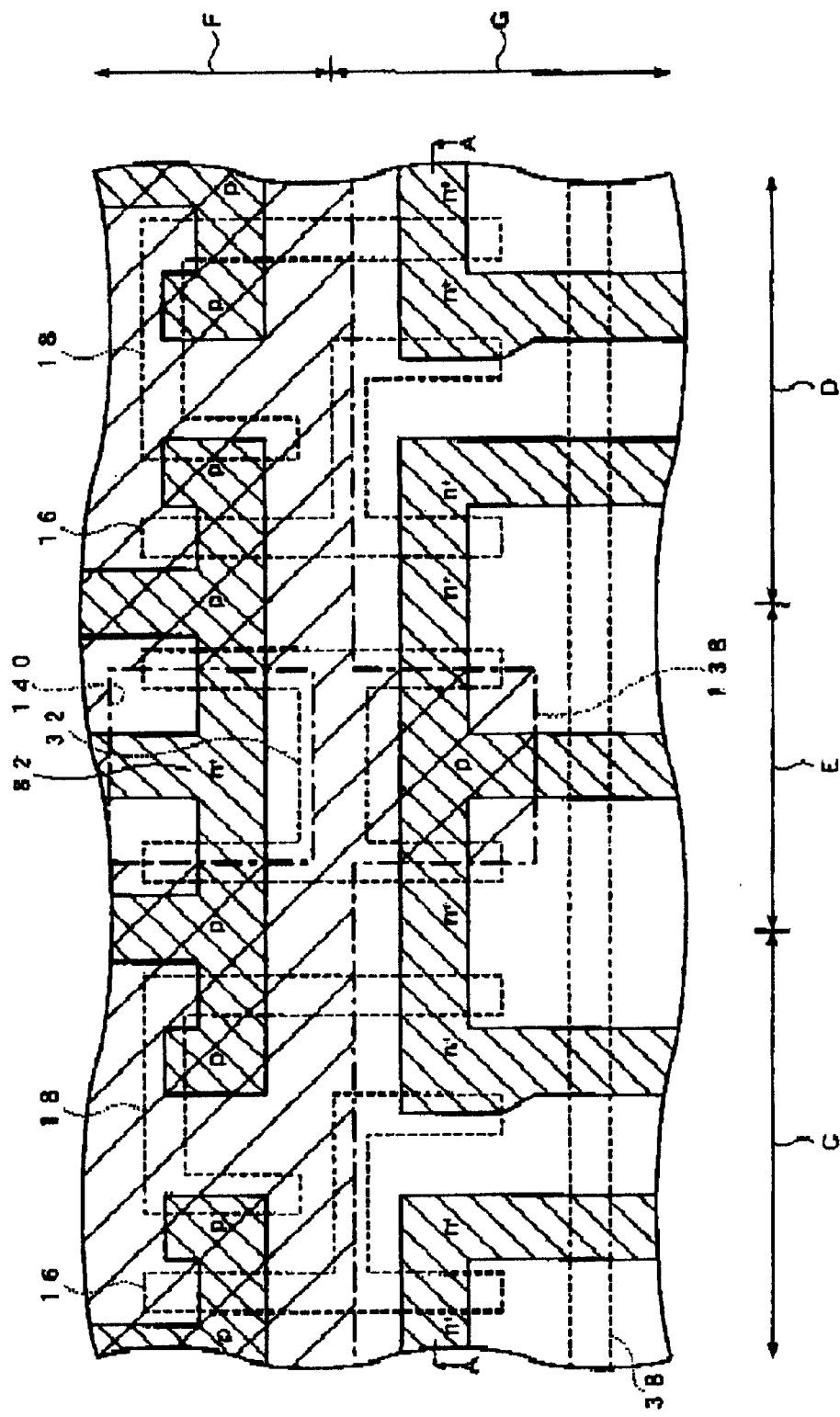
FIG. 16 is a plan view of a silicon substrate in a sixth step in a method for manufacturing a semiconductor memory device in accordance with one embodiment of the present invention.

As shown in FIGS. 15 and 16, a resist 138 is formed on the entire main surface of the p⁻⁻type silicon substrate 10. The resist 138 is exposed to light to pattern the resist 138. The p-channel transistor-forming region F is covered by the resist 138. However, an opening 140 is provided in a region where the well contact region is formed. The n-channel transistor-forming region G is exposed. However, an area where the well contact region is formed is covered by the resist 138.

Arsenic ions are implanted in the well 12 using the resist 138, the LOCOS oxide film 96, the gate electrode 120, the wiring layer 24, the gate electrode 122, the dummy gate 124 and dummy gate 126 as masks. The energy for the ion implantation is, for example, 45–55 KeV. The dose of ions for the ion implantation is, for example, $1.5 \times 10^{15} - 2.5 \times 10^{15}/cm^2$. As a result, an n-type high concentration region is formed in the well 12. The n-type high concentration region becomes to be a high concentration region of the source region of the LDD structure or a high concentration region of the drain region of the LDD structure. An ntype high concentration region is also formed in the p-channel transistor-forming region F by the ion implantation. The n-type high concentration region becomes to be a well contact region 82.

Figure 17:
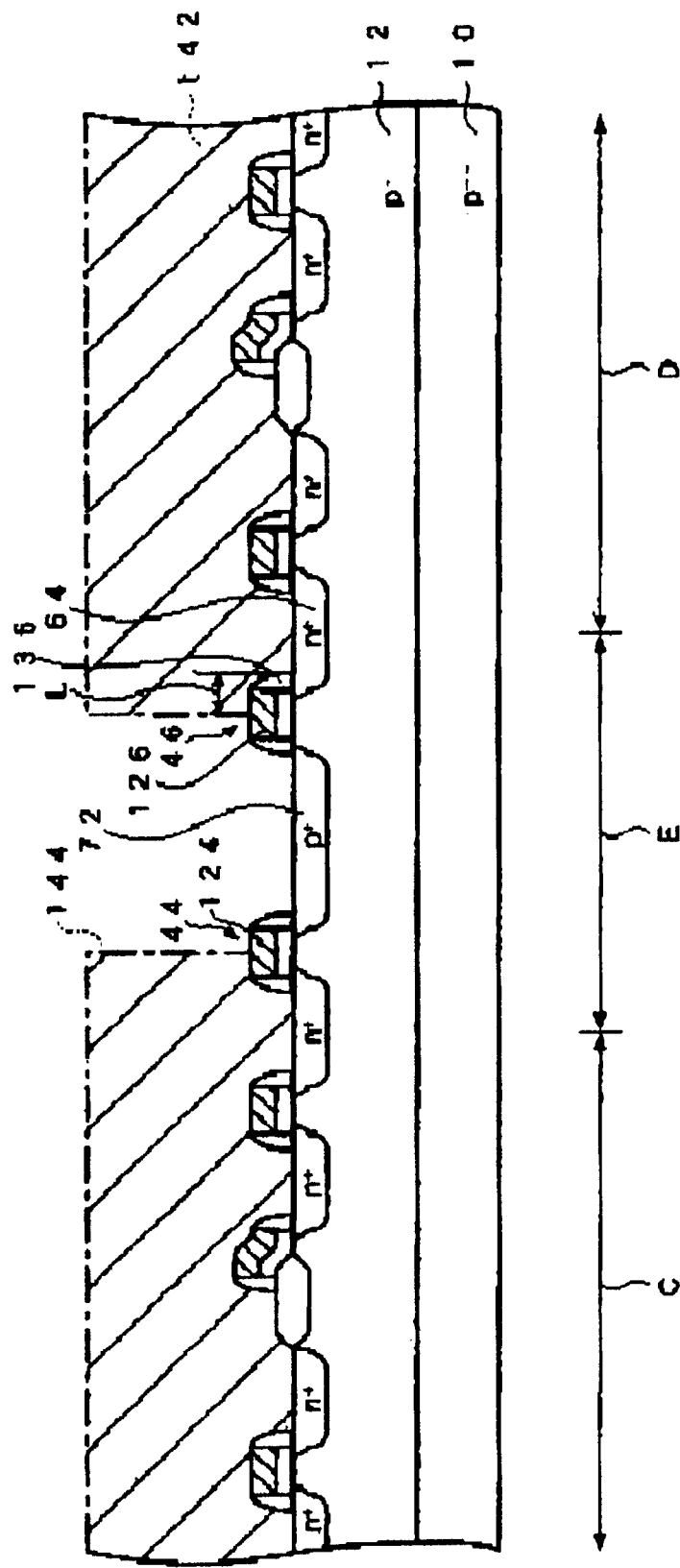
FIG. 17 is a cross-sectional view of a silicon substrate in a seventh step in a method for manufacturing a semiconductor memory device in accordance with one embodiment of the present invention.
Figure 18:
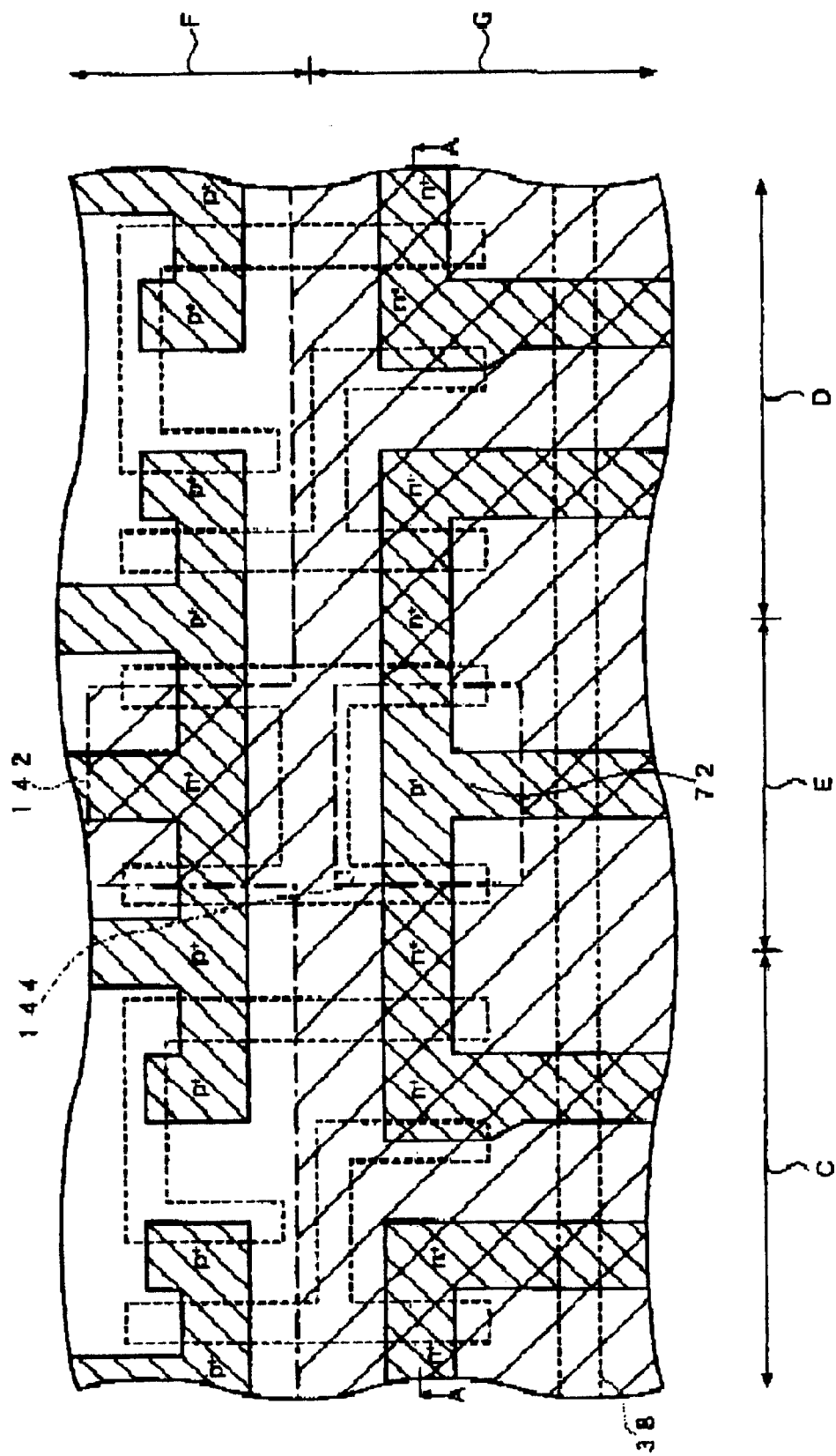
FIG. 18 is a plan view of a silicon substrate in a seventh step in a method for manufacturing a semiconductor memory device in accordance with one embodiment of the present invention.

As shown in FIGS. 17 and 18, a resist 142 is formed on the entire main surface of the p⁻⁻type silicon substrate 10. The resist 142 is exposed to light to pattern the resist 142. The n-channel transistor-forming region G is covered by the resist 142. However, an opening 144 is provided in a well contact forming region where the well contact region is formed. The p-channel transistor-forming region F is exposed. However, an area where the well contact region is formed is covered by the resist 142.

Boron ions are implanted in the well 12 using the resist 132 and the like as a mask. The energy for the ion implantation is, for example, 8–12 KeV. The dose of ions for the ion implantation is, for example, $2.5 \times 10^{15}$–$3.5 \times 10^{15}/cm^2$. As a result, a p-type high concentration region is formed in the well 12. The p-type high concentration region becomes to be a well contact region 72. The well contact region 72 is formed in a self-alignment manner using the dummy elements 44 and 46 as masks. A p-type high concentration region is also formed in the p-channel transistor-forming region F by the ion implantation. The p-type high concentration region becomes to be a high concentration region of the source region of the LDD structure or a high concentration region of the drain region of the LDD structure.

The steps described above complete a device element-forming layer. The wiring layers shown in FIG. 4 may be formed by an ordinary method, and thus the description therefore is omitted.

As shown in FIGS. 1–3, in accordance with one embodiment of the present invention, the border region E has a length that is equivalent to one half of the length $L_1$ between one of side sections of a gate electrode of the driver transistor $Q_3$ on the side of the dummy element 28 and one of side sections of the dummy element 28 on the side of the gate electrode of the driver transistor $Q_3$+(plus) the length $L_2$ of the dummy element 28+the length $L_3$ between one of the side sections of the dummy element 28 on the side of the dummy element 30 and one of side sections of the dummy element 30 on the side of the dummy element 28+the length $L_4$ of the dummy element 30+one half of the length $L_5$ between one of side sections of a gate electrode of the driver transistor $Q_4$ on the side of the dummy element 30 and one of the side sections of the dummy element 30 on the side of the gate electrode of the driver transistor $Q_4$. In accordance with the embodiment of the present invention, the border region E has a length defined by the above-described values. As a result, while dummy elements are formed, a higher integration of an SRAM and the reduction of the chip size can be achieved. In other words, a higher integration of an SRAM can be achieved with the same chip size. The chip size can be reduced with the same number of element devices.

In accordance with one embodiment of the present invention, p-n junctions are prevented from being formed in word lines. Namely, the resist 132 is patterned such that the opening 134 does not expose the word line 38 as shown in FIG. 12, and the resist 142 is patterned such that the opening 144 does not expose the word line 38. As a result, p-type impurities are not injected in the word line 38. Also, as shown in FIGS. 10 and 16, n-type impurities are injected in the word line 38. Accordingly, p-n junctions are not formed in the word line 38. If p-n junctions are formed in the word line 38, a problem arises in which the conductivity of the word line 38 deteriorates.

Figure 19:
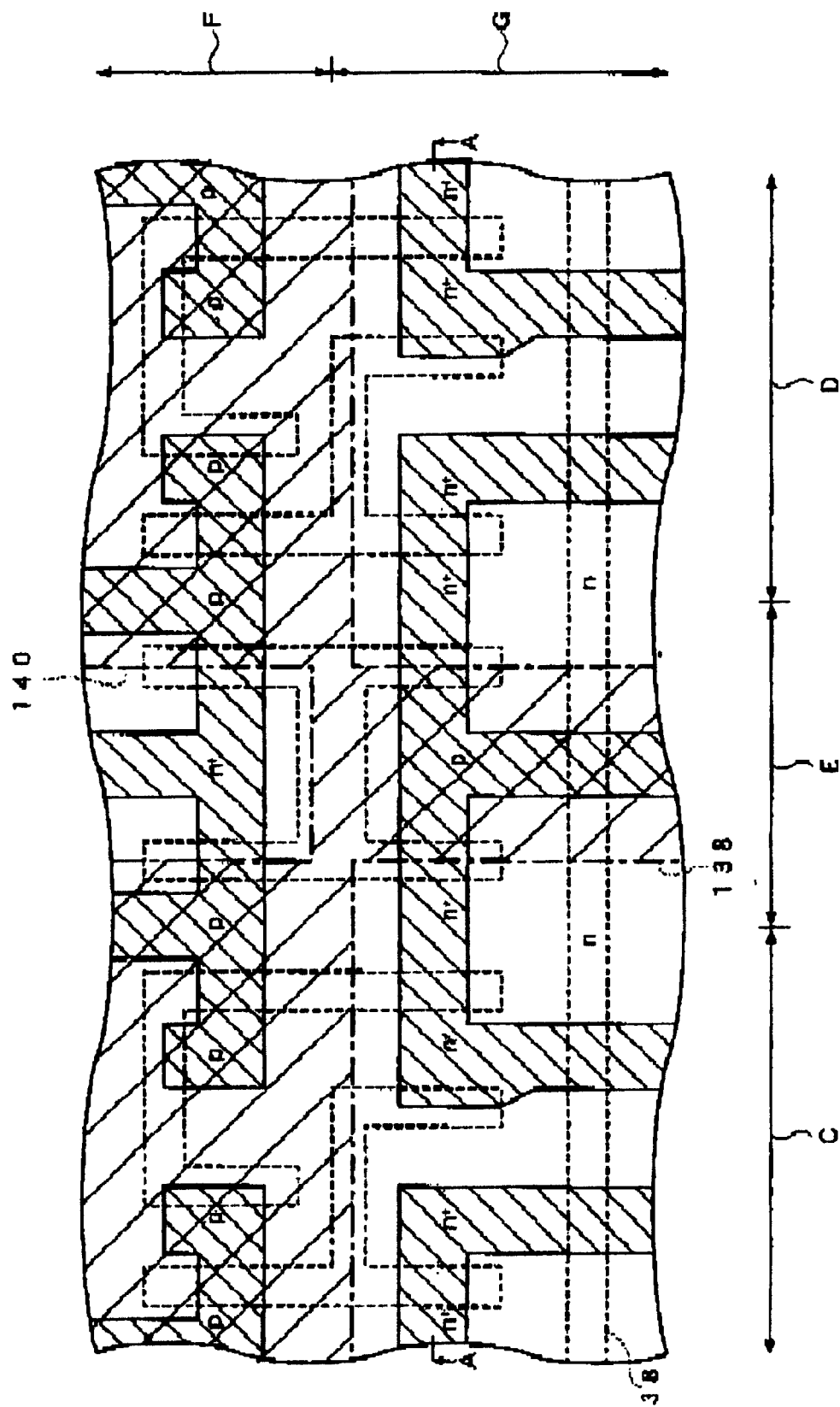
FIG. 19 is a plan view of a silicon substrate in a first step when p-n junctions are formed in a word line.
Figure 20:
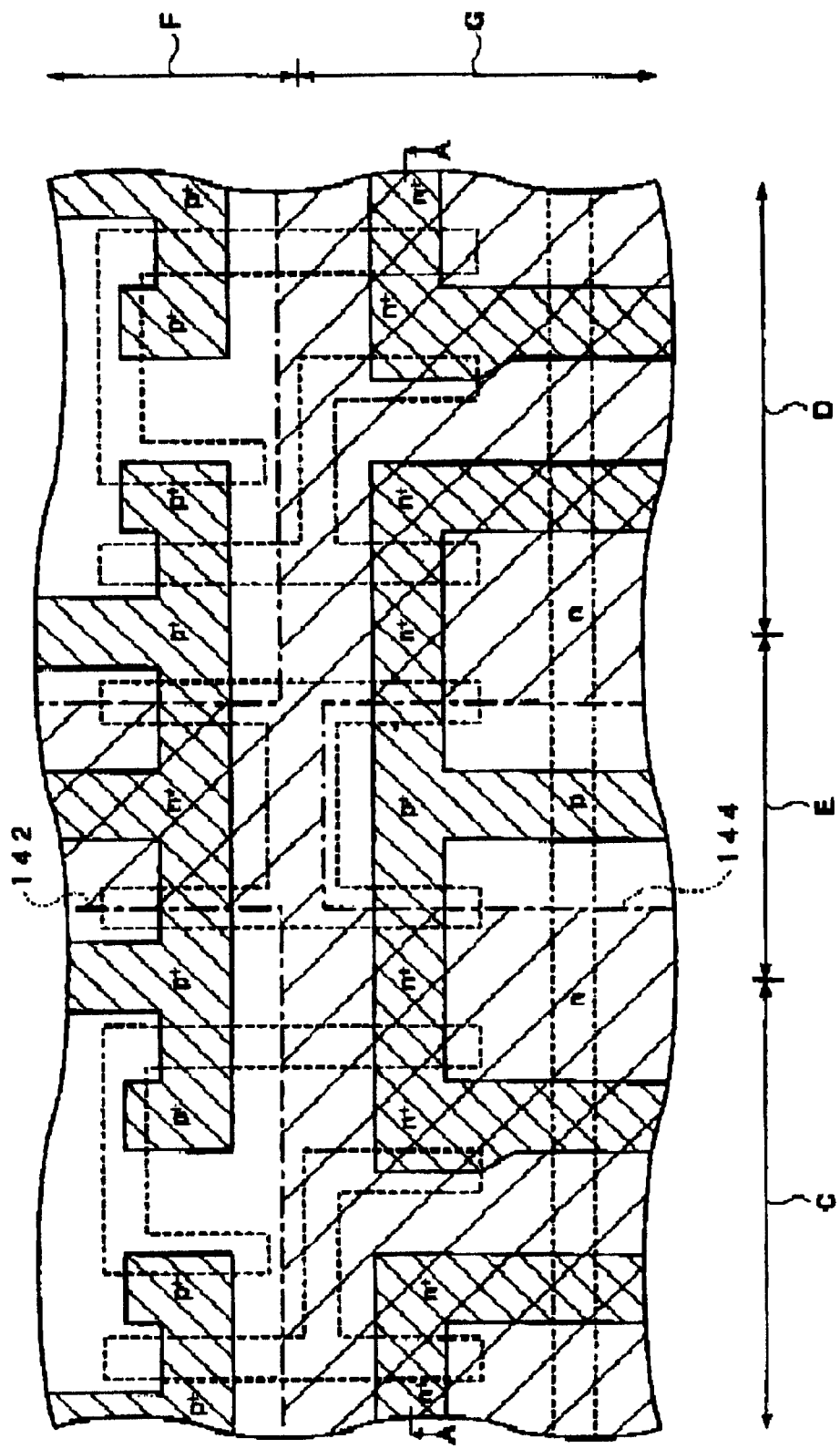
FIG. 20 is a plan view of a silicon substrate in a second step when p-n junctions are formed in the word line.

For example, p-n junctions would be formed in the word line 38 if resists are patterned in the following manner. In the step shown in FIG. 16, the resist 138 is patterned such that the resist 138 covers a part of the word line 38, as shown in FIG. 19. In the step shown in FIG. 18, the resist 142 is patterned such that the opening 144 exposes a part of the word line 38, as shown in FIG. 20. By such patterning of the resists, p-n junctions are formed at two locations in the word line 38.

As shown in FIG. 17, in accordance with one embodiment of the present invention, the value L equivalent to one half of the length of the dummy element 46 is greater than an alignment error that may occur at the time of forming the resist 142. In one embodiment, the value L equivalent to one half of the length of the dummy element 46 equals to one half of the length of the dummy gate 126 plus the length of the side wall dielectric film 136. As a result, the opening 144 is prevented from being positioned on the source region 64. If the opening 144 is located on the source region 64, the following problems occur.

Figure 21:
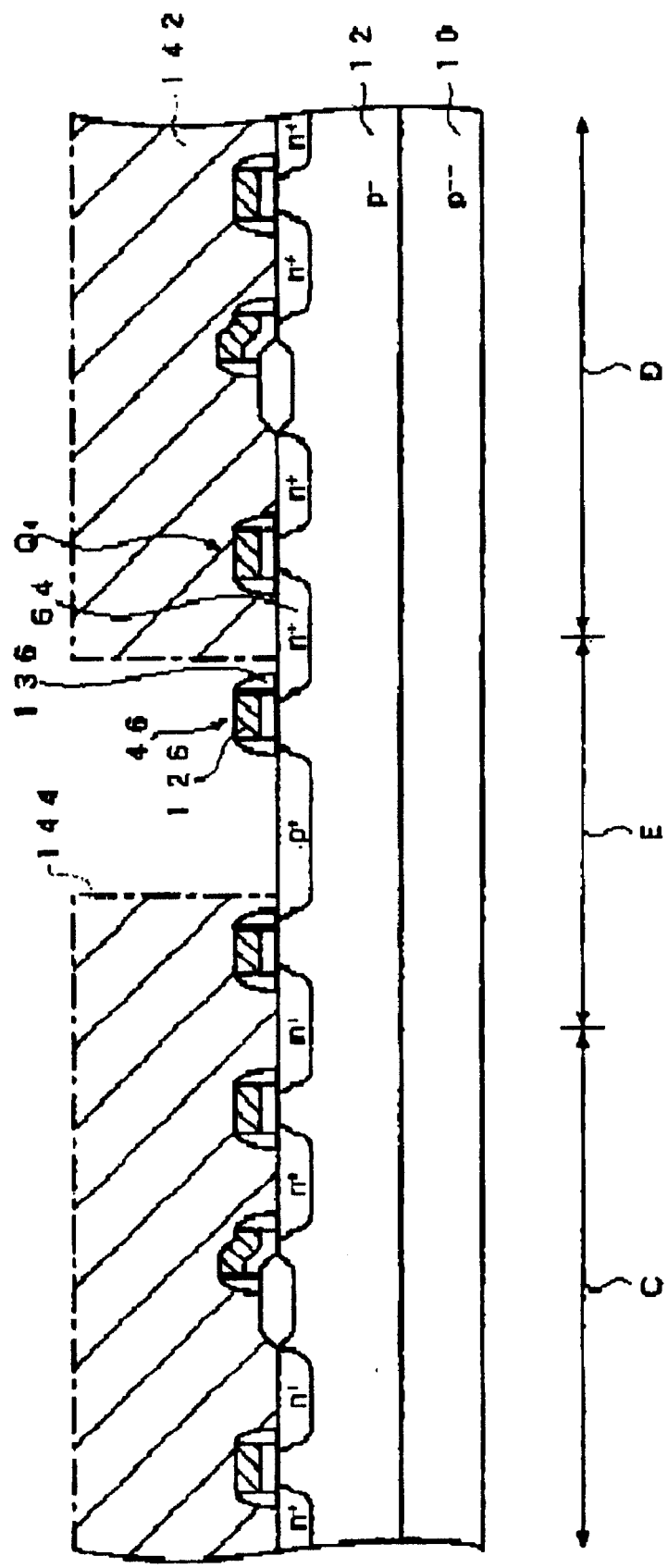
FIG. 21 is a cross-sectional view of a silicon substrate when the opening 144 is located on the source region 64.

As shown in FIG. 21, if the opening 144 is located on the source region 64, p-type ions are injected in the n-type source region 64 of the driver transistor $Q_4$. As a result, there is a possibility that the driver transistor $Q_4$ may not normally operate. The description above is directed to the dummy element 46. However, the same principle applies to the dummy element 44. More specifically, the value L equivalent to one half of the length of the dummy element 44 is greater than an alignment error that may occur at the time of forming the resist 142.

When the value L equivalent to one half of the length of the dummy element 46 is one half of the length of the dummy gate 126, the opening 134 is prevented from being located on the low concentration region 65 when the low concentration region shown in FIG. 11 is formed.

While the description above refers to particular embodiments of the present invention, it will be understood that many modifications may be made without departing from the spirit thereof The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A semiconductor memory device, comprising:
   a semiconductor substrate having a main surface;
   a well formed in the semiconductor substrate;
   a first memory cell region that is part of the main surface and located over the well;
   a second memory cell region that is part of the main surface and located over the well;
   a plurality of memory cells formed in the first and second memory cell regions;
   a border region that is part of the main surface, and is located over the well on a region between the first memory cell region and the second memory cell region;

a well contact region that is formed in the well in the border region, wherein the well contact region electrically connects to a wiring layer for fixing the voltage of the well;

a first dummy element and a second dummy element, wherein the first a second dummy elements are formed in the border region and do not function as device elements;

a first transistor that is a component of the memory cell, wherein the first transistor is formed in the first memory cell region and is located adjacent to the first dummy element; and a second transistor that is a component of the memory cell, wherein the second transistor is formed in the second memory cell region and is located adjacent to the second dummy element;

wherein the border region has a length that is equivalent to the sum of one half of the distance between a gate electrode of the first transistor and the first dummy element, the length of the first dummy element, the distance between the first dummy element and the second dummy element, the length of the second dummy element, and one half of the distance between a gate electrode of the second transistor and the second dummy element, wherein the well contact region is a first conductivity type, and a word line that extends from the first memory cell region to the second memory cell region, and passes through the border region, wherein the word line is a second conductivity type.

2. A semiconductor memory device comprising:

a semiconductor substrate having a main surface, a well, a plurality of memory cells, a first memory cell region, a second memory cell region, a border region, a first source region, a second source region, a well contact region, a first dummy element and a second dummy element, wherein the well is formed in the semiconductor substrate;

the first and second memory cell regions are part of the main surface and are located over the well;

the memory cells are formed in the first and second memory cell regions;

the border region is part of the main surface, and is located over the well on a border between the first memory cell region and the second memory cell region;

the first source region is formed in the well and extends over the border region and the first memory cell region;

the second source region is formed in the well and extends over the border region and the second memory cell region;

the well contact region is formed in the well in the border region;

the well contact region electrically connects to a wiring layer for fixing the voltage of the well;

the first and second dummy elements are formed in the border region and do not function as device elements; and the border region has a length that is equivalent to the sum of one half of the length of the first source region, the length of the first dummy element, the length of the well contact region, the length of the second dummy element, and one half of the length of the second source region.

3. A semiconductor memory device comprising:

a semiconductor substrate;

a first conductivity type well region provided in the semiconductor substrate;

a first memory cell region provided over the well region;

a second memory cell region provided over the well region; and a border region provided over the well region and between the first memory cell region and the second memory cell region, wherein the border region includes first and second dummy wirings disposed over the well region, a first impurity region of a second conductivity type shared by the first memory cell region and the border region and disposed adjacent to the first dummy wiring, a well contact region of a first conductivity type between the first dummy wiring and the second dummy wiring, and a second impurity region of the second conductivity type shared by the second memory cell region and the border region and disposed adjacent to the second dummy wiring.

4. A semiconductor memory device according to claim 1, wherein the well contact region is formed in a self-alignment manner using the first and second dummy elements as masks.

5. A semiconductor memory device according to claim 1, wherein each of the memory cells includes a first load transistor, a second load transistor, a first driver transistor and a second driver transistor that form a flip-flop.

6. A semiconductor memory device according to claim 5, further comprising a first conductive layer and a second conductive layer; wherein the first and second conductive layers are formed in the first and second memory cell region, the first conductive layer serving as gate electrodes of the first load transistor and the first driver transistor, the second conductive layer serving as gate electrodes of the second load transistor and the second driver transistor, and wherein the first conductive layer is generally in the shape of a letter "h" and the second conductive layer is generally in the shape of the number "7".

7. A semiconductor memory device according to claim 1, wherein the semiconductor memory device is an SRAM.

8. A semiconductor memory device according to claim 1, wherein each of the first and second dummy elements has a length equivalent to the length of a gate electrode of each of the memory cells.

9. A semiconductor memory device according to claim 1, wherein one half of the length of each of the first and second dummy elements is greater than an alignment error that occurs when a mask member to be used for forming the well contact region is formed.

10. A semiconductor memory device according to claim 2, wherein the well contact region is formed in a self-alignment manner using the first and second dummy elements as masks.

11. A semiconductor memory device according to claim 2, wherein the well contact region is of a first conductivity type, and further comprising:

a word line that extends from the first memory cell region to the second memory cell region, and passes through the border region, wherein the word line is of a second conductivity type.

12. A semiconductor memory device according to claim 2, wherein each of the memory cells includes a first load transistor, a second load transistor, a first driver transistor and a second driver transistor that form a flip-flop.

13. A semiconductor memory device according to claim 12, further comprising a first conductive layer and a second conductive layer; wherein the first and second conductive layers are formed in the first and second memory cell region, the first conductive layer serving as gate electrodes of the first load transistor and the first driver transistor, the second conductive layer serving as gate electrodes of the second load transistor and the second driver transistor, and wherein the first conductive layer is generally in the shape of a letter "h" and the second conductive layer is generally in the shape of the number "7".

14. A semiconductor memory device according to claim 2, wherein the semiconductor memory device is an SRAM.

15. A semiconductor memory device according to claim 2, wherein each of the first and second dummy elements has a length equivalent to the length of a gate electrode of each of the memory cells.

16. A semiconductor memory device according to claim 2, wherein one half of the length of each of the first and second dummy elements is greater than an alignment error that occurs when a mask member to be used for forming the well contact region is formed.

17. A semiconductor memory device according to claim 3, wherein the well contact region is formed in a self-alignment manner using the first and second dummy elements as masks.

18. A semiconductor memory device according to claim 3, wherein the well contact region is of a first conductivity type, and further comprising:

a word line that extends from the first memory cell region to the second memory cell region, and passes through the border region, wherein the word line is of a second conductivity type.

19. A semiconductor memory device according to claim 3, wherein each of the memory cells includes a first load transistor, a second load transistor, a first driver transistor and a second driver transistor that form a flip-flop.

20. A semiconductor memory device according to claim 19, further comprising a first conductive layer and a second conductive layer; wherein the first and second conductive layers are formed in the first and second memory cell region, the first conductive layer serving as gate electrodes of the first load transistor and the first driver transistor, the second conductive layer serving as gate electrodes of the second load transistor and the second driver transistor, and wherein the first conductive layer is generally in the shape of a letter "h" and the second conductive layer is generally in the shape of the number "7".

21. A semiconductor memory device according to claim 3, wherein the semiconductor memory device is an SRAM.

22. A semiconductor memory device according to claim 3, wherein each of the first and second dummy elements has a length equivalent to the length of a gate electrode of each of the memory cells.

23. A semiconductor memory device according to claim 3, wherein one half of the length of each of the first and second dummy elements is greater than an alignment error that occurs when a mask member to be used for forming the well contact region is formed.

\* \* \* \* \*